(12) United States Patent
Ishida et al.

(10) Patent No.: US 12,413,051 B2
(45) Date of Patent: Sep. 9, 2025

(54) SURFACE EMITTING LASER MODULE, OPTICAL DEVICE, AND SURFACE EMITTING LASER SUBSTRATE

(71) Applicant: RICOH COMPANY, LTD., Tokyo (JP)

(72) Inventors: Misaki Ishida, Kanagawa (JP); Naoto Jikutani, Miyagi (JP); Kazuma Izumiya, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 1107 days.

(21) Appl. No.: 17/419,826

(22) PCT Filed: Jan. 28, 2020

(86) PCT No.: PCT/JP2020/003011
§ 371 (c)(1),
(2) Date: Jun. 30, 2021

(87) PCT Pub. No.: WO2020/158744
PCT Pub. Date: Aug. 6, 2020

(65) Prior Publication Data
US 2021/0399523 A1      Dec. 23, 2021

(30) Foreign Application Priority Data
Jan. 31, 2019   (JP) .................................. 2019-016353

(51) Int. Cl.
*H01S 5/00*        (2006.01)
*H01S 5/02253*     (2021.01)
(Continued)

(52) U.S. Cl.
CPC .............. *H01S 5/423* (2013.01); *H01S 5/005* (2013.01); *H01S 5/02253* (2021.01);
(Continued)

(58) Field of Classification Search
USPC ........................................................ 356/4.01
See application file for complete search history.

(56) References Cited

U.S. PATENT DOCUMENTS 6,724,794 B2 *  4/2004  Dudoff ............... H01L 33/0095
                                                         372/12
6,956,244 B2 * 10/2005  Dudoff ................. H01L 33/385
                                                     257/E25.032
(Continued)

FOREIGN PATENT DOCUMENTS

JP      H08-288590 A    11/1996
JP      2007-142425 A   6/2007
(Continued)

OTHER PUBLICATIONS

Office Action issued on Aug. 2, 2022, in corresponding Japanese patent Application No. 2019-016353, 2 pages.
(Continued)

*Primary Examiner* — James R Hulka
(74) *Attorney, Agent, or Firm* — XSENSUS LLP

(57) ABSTRACT

A surface emitting laser module includes a base substrate, a surface emitting laser substrate mounted on the base substrate, the surface emitting laser substrate including a surface emitting laser element, and the surface emitting laser substrate having a first face facing the base substrate and a second face facing away from the base substrate, and an optical member facing the second face and including an optical element configured to receive light emitted from the second face of the surface emitting laser element. The surface emitting laser element includes a first semiconductor layer, a second semiconductor layer, a first electrode provided on the first face and connected to the first semiconductor layer, and a second electrode provided on the first face and connected to the second semiconductor layer. The
(Continued)

base substrate includes a third electrode connected to the first electrode and a fourth electrode connected to the second electrode.

14 Claims, 24 Drawing Sheets

(51) Int. Cl.
  *H01S 5/0234* (2021.01)
  *H01S 5/0237* (2021.01)
  *H01S 5/042* (2006.01)
  *H01S 5/183* (2006.01)
  *H01S 5/42* (2006.01)
  *G01S 7/481* (2006.01)

(52) U.S. Cl.
  CPC .......... *H01S 5/0234* (2021.01); *H01S 5/0237* (2021.01); *H01S 5/04256* (2019.08); *H01S 5/18305* (2013.01); *G01S 7/4814* (2013.01)

(56) References Cited

U.S. PATENT DOCUMENTS

| | | | |
|---|---|---|---|
| 6,959,025 B2 | 10/2005 | Jikutani et al. | |
| 7,180,100 B2 | 2/2007 | Takahashi et al. | |
| 7,324,717 B2 | 1/2008 | Chua et al. | |
| 7,700,955 B2 | 4/2010 | Kuwata et al. | |
| 7,777,173 B2* | 8/2010 | Price | G01S 7/481 250/221 |
| 9,859,681 B2 | 1/2018 | Adachi et al. | |
| 9,966,730 B2 | 5/2018 | Adachi et al. | |
| 10,244,181 B2* | 3/2019 | Warren | H04N 23/56 |
| 2003/0013217 A1 | 1/2003 | Dudoff et al. | |
| 2004/0200573 A1 | 10/2004 | Dudoff et al. | |
| 2005/0040413 A1* | 2/2005 | Takahashi | B82Y 20/00 257/96 |
| 2005/0100068 A1* | 5/2005 | Jikutani | B82Y 20/00 372/96 |
| 2007/0126010 A1* | 6/2007 | Chua | H01L 31/02327 257/E31.127 |
| 2007/0241933 A1 | 10/2007 | Price et al. | |
| 2008/0224167 A1* | 9/2008 | Kuwata | H01L 27/15 257/E33.062 |
| 2016/0043528 A1 | 2/2016 | Adachi et al. | |
| 2016/0164261 A1 | 6/2016 | Warren | |
| 2016/0336716 A1* | 11/2016 | Adachi | H01L 33/486 |

FOREIGN PATENT DOCUMENTS

| | | |
|---|---|---|
| JP | 2007-227676 A | 9/2007 |
| JP | 2008-517279 A | 5/2008 |
| JP | 2008-226948 A | 9/2008 |
| JP | 2008-227404 A | 9/2008 |
| JP | 2010-191123 A | 9/2010 |
| JP | 2015-028658 A | 2/2015 |
| JP | 2016-213412 A | 12/2016 |
| JP | 2017-017296 A | 1/2017 |
| WO | 2009/001461 A1 | 12/2008 |

OTHER PUBLICATIONS

Office Action issued Jan. 17, 2023, in Korean Patent Application No. 10-2021-7020618, 11 pages.

Office Action issued Jul. 13, 2022, in Korean Patent Application No. 10-2021-7020618, 10 pages.

International Search Report and Written Opinion issued Apr. 21, 2020 in PCT/JP2020/003011 filed Jan. 28, 2020.

* cited by examiner

[Fig. 1]
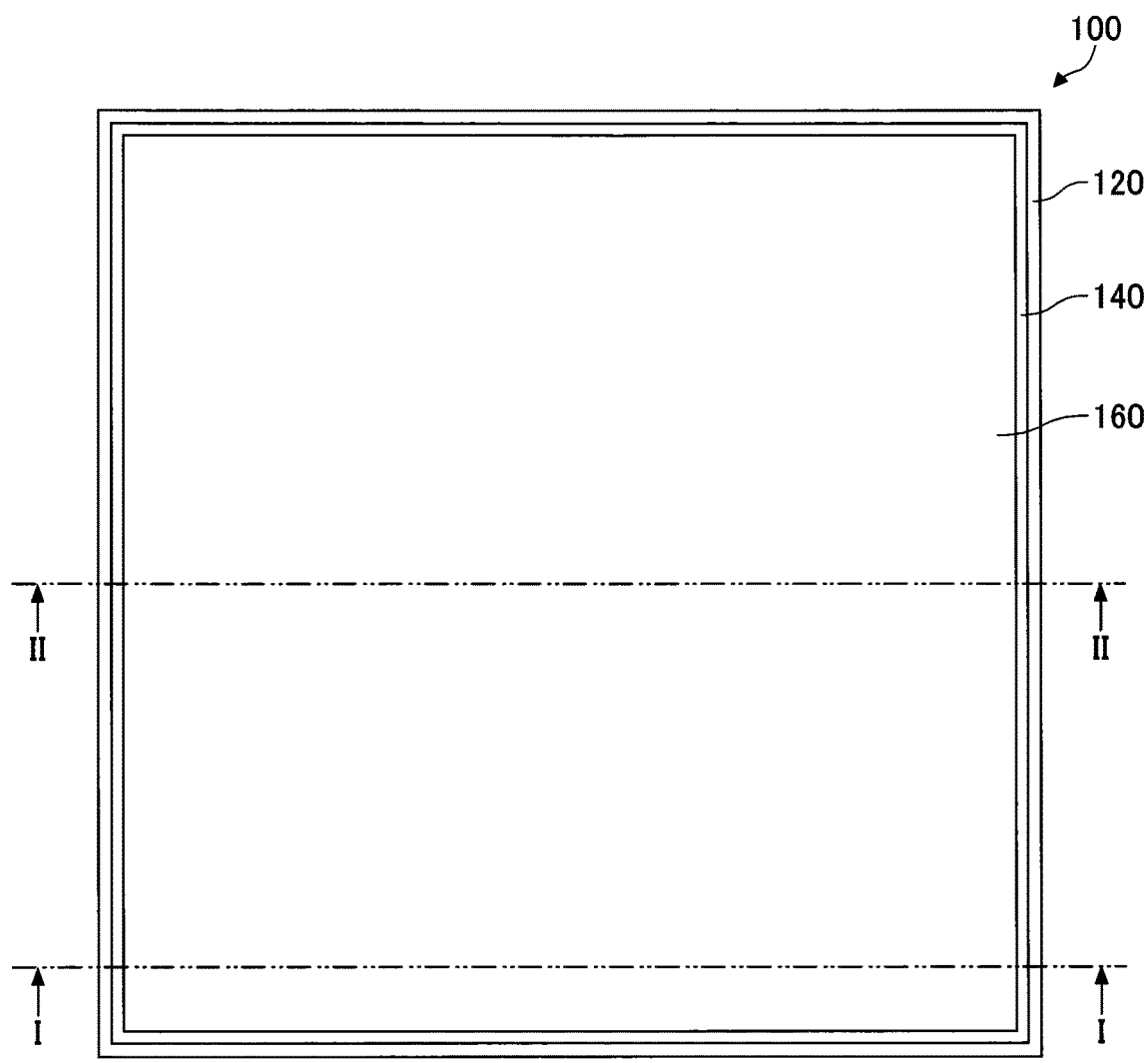

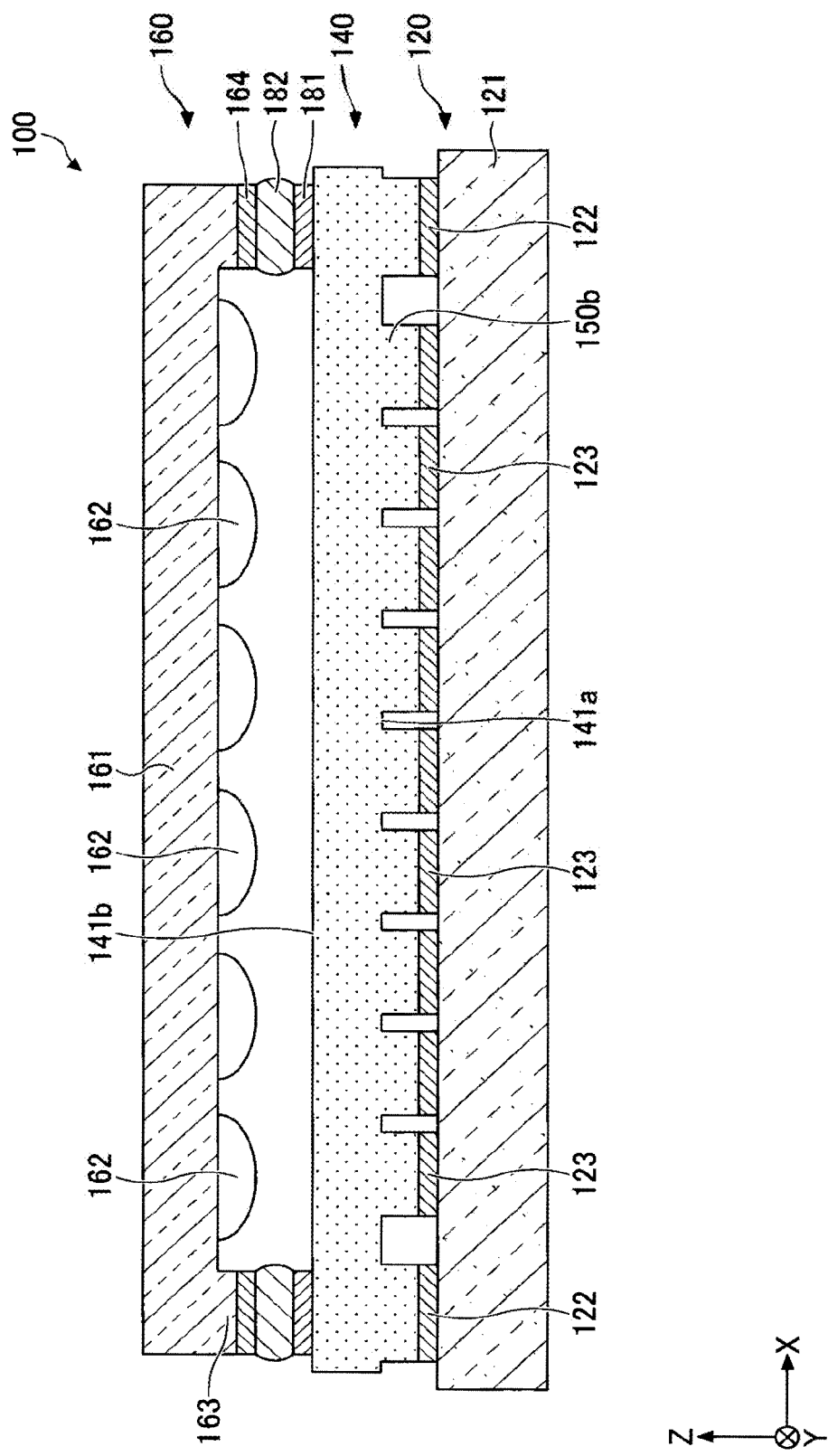
[Fig. 2]

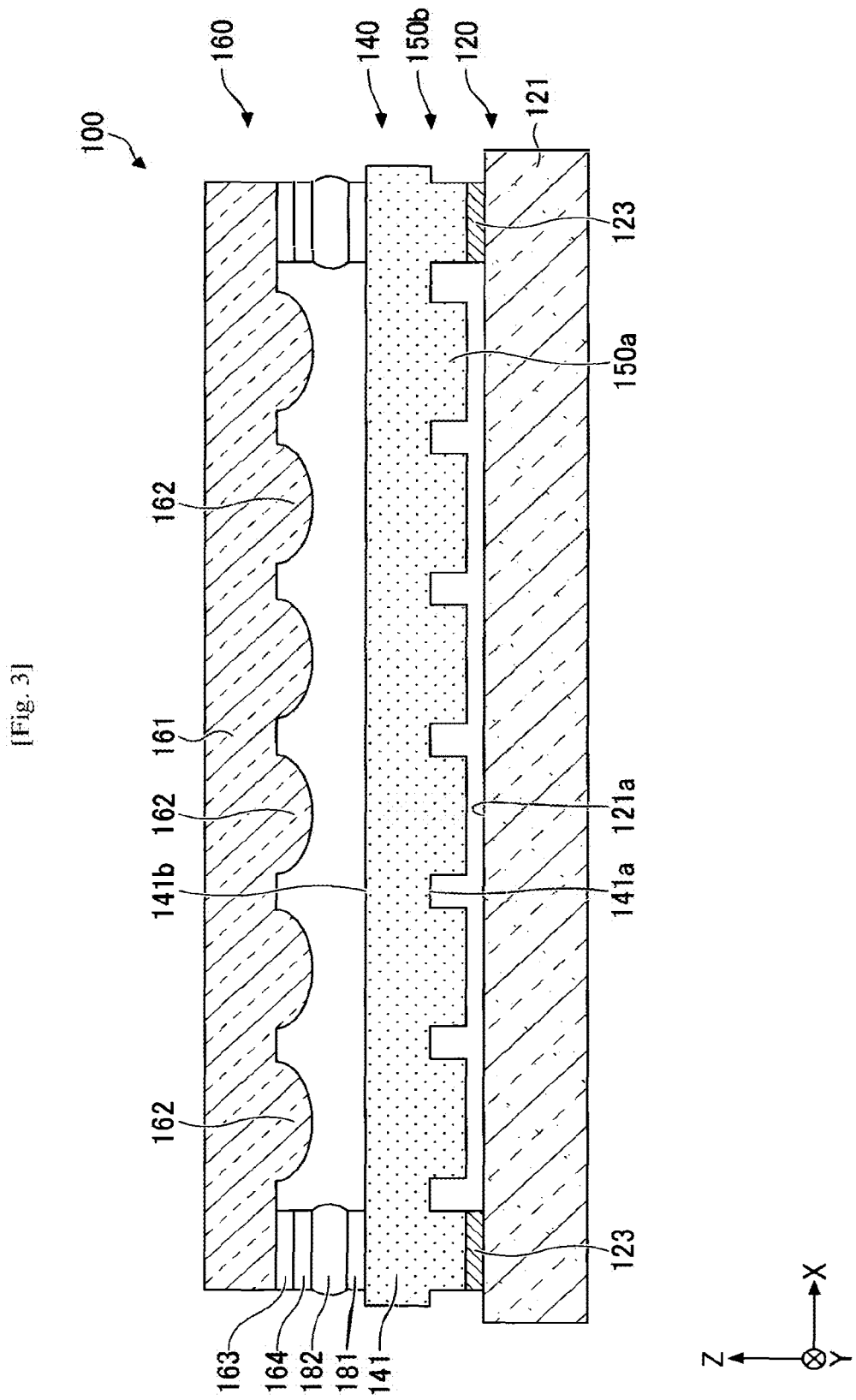

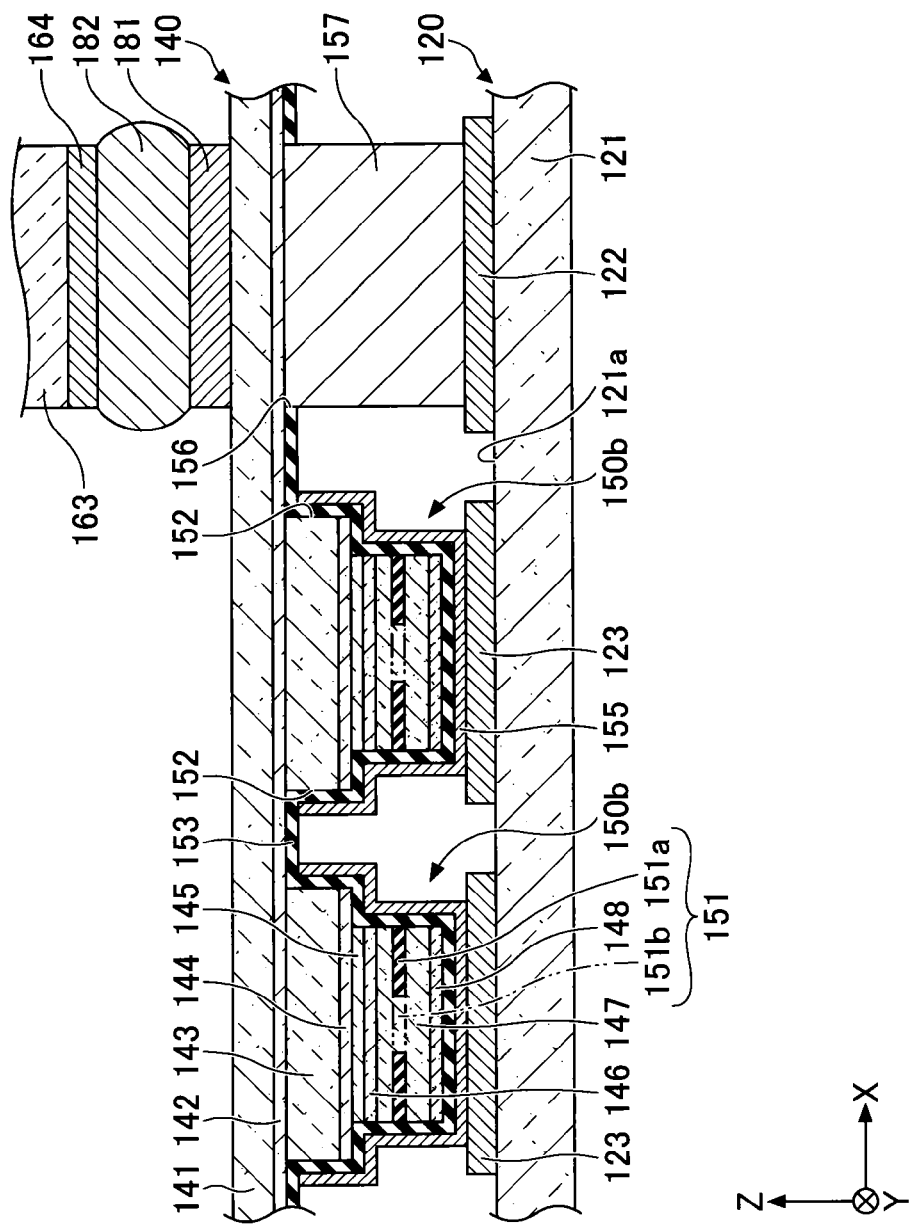

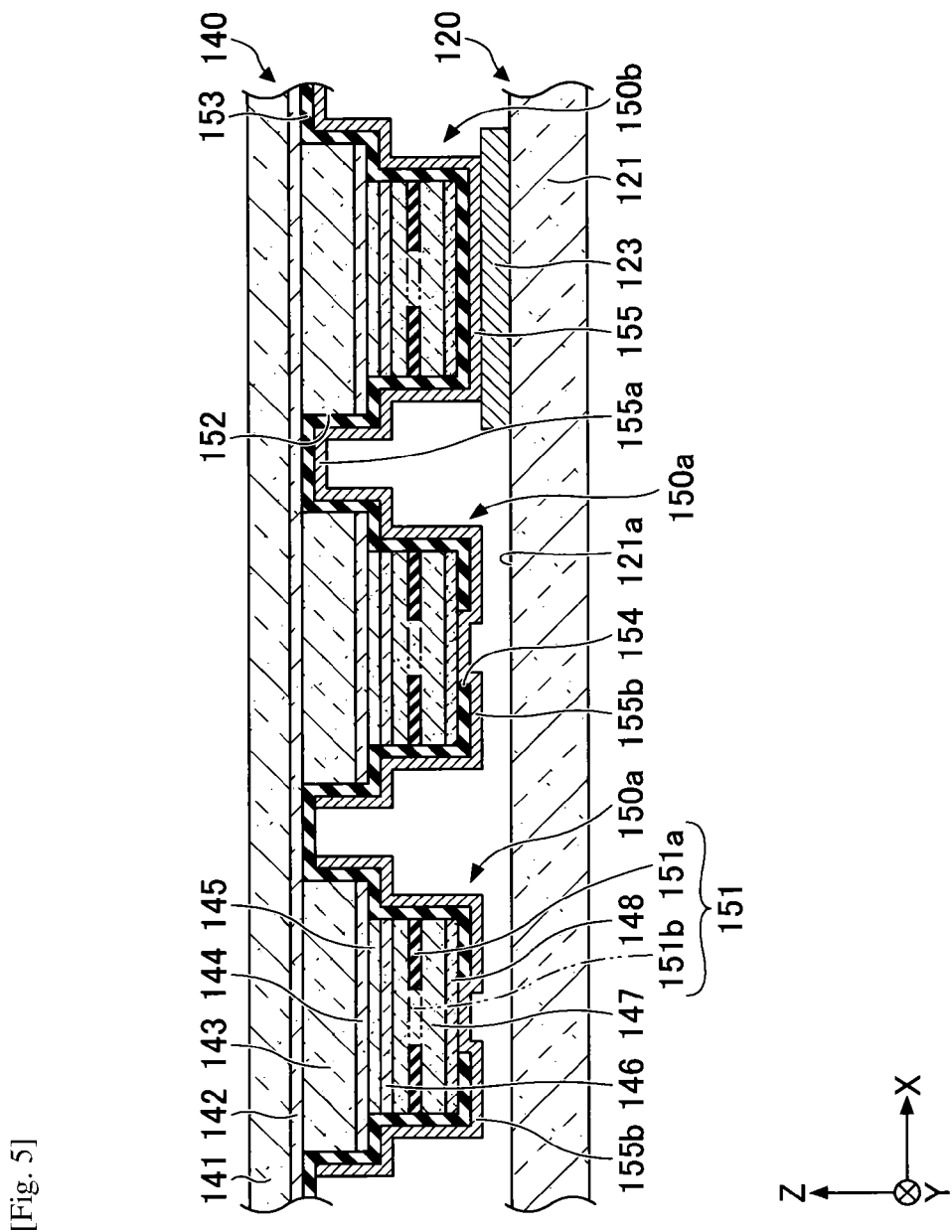
[Fig. 5]

[Fig. 6]
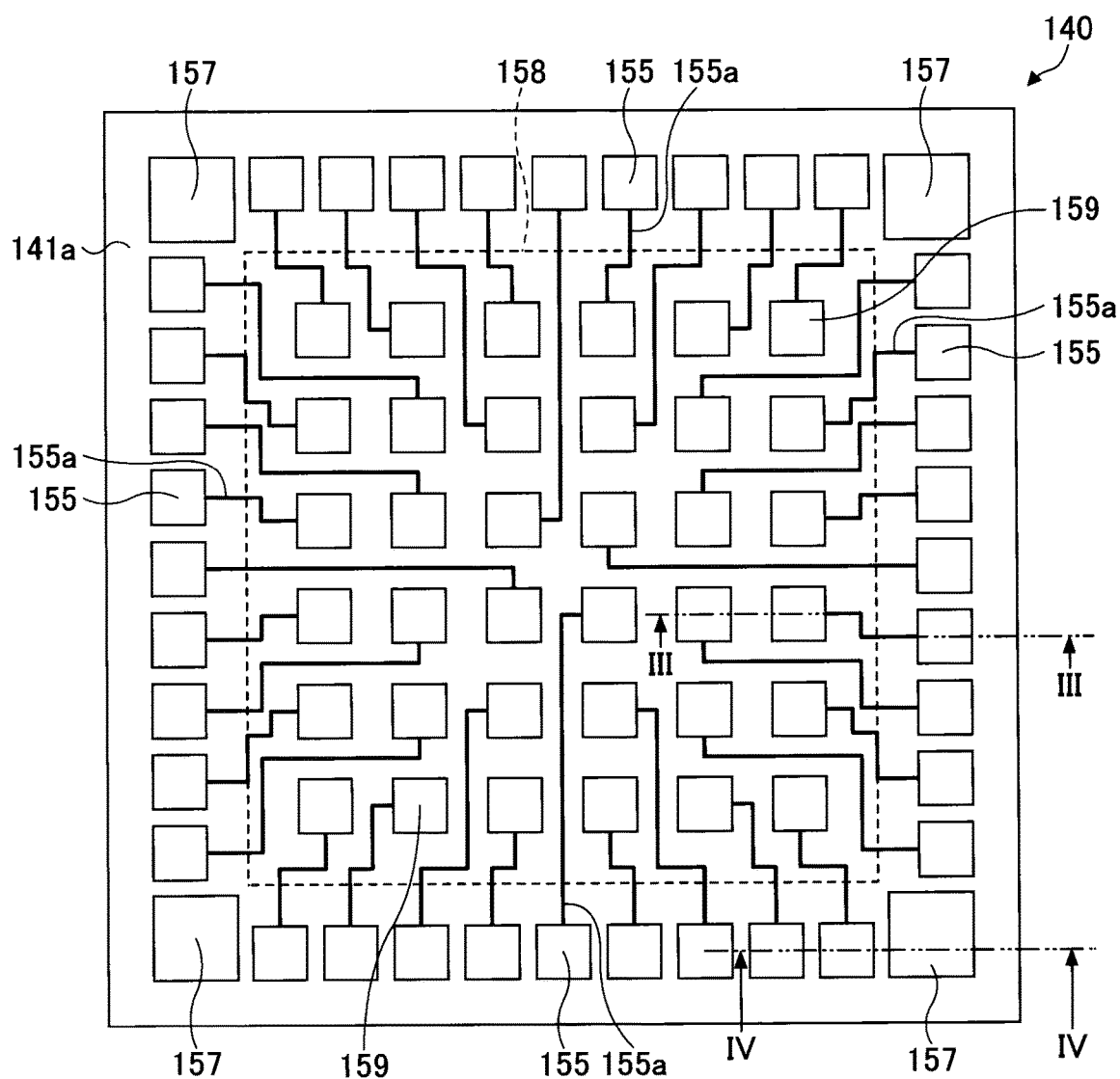

[Fig. 7]
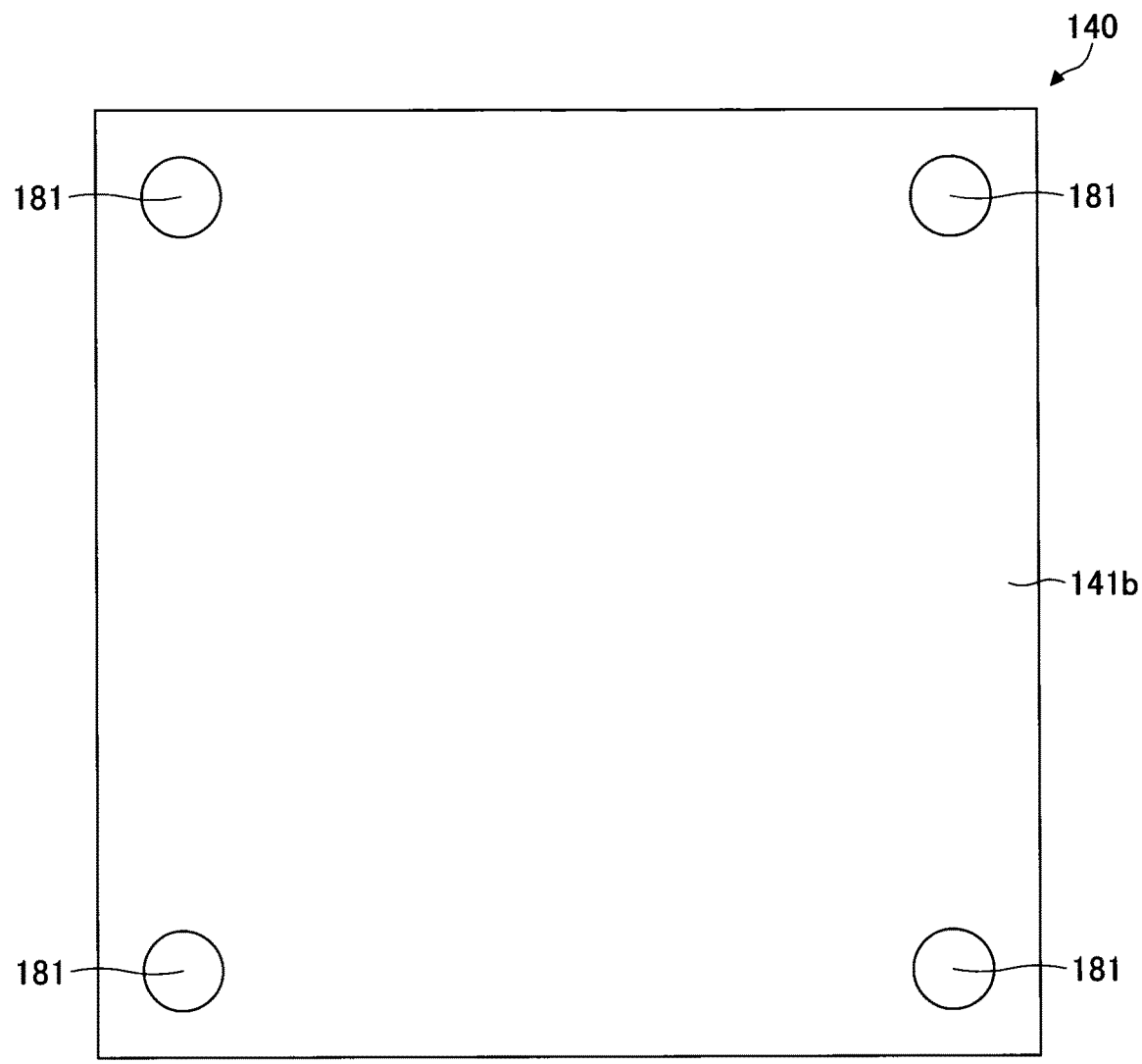

[Fig. 8]
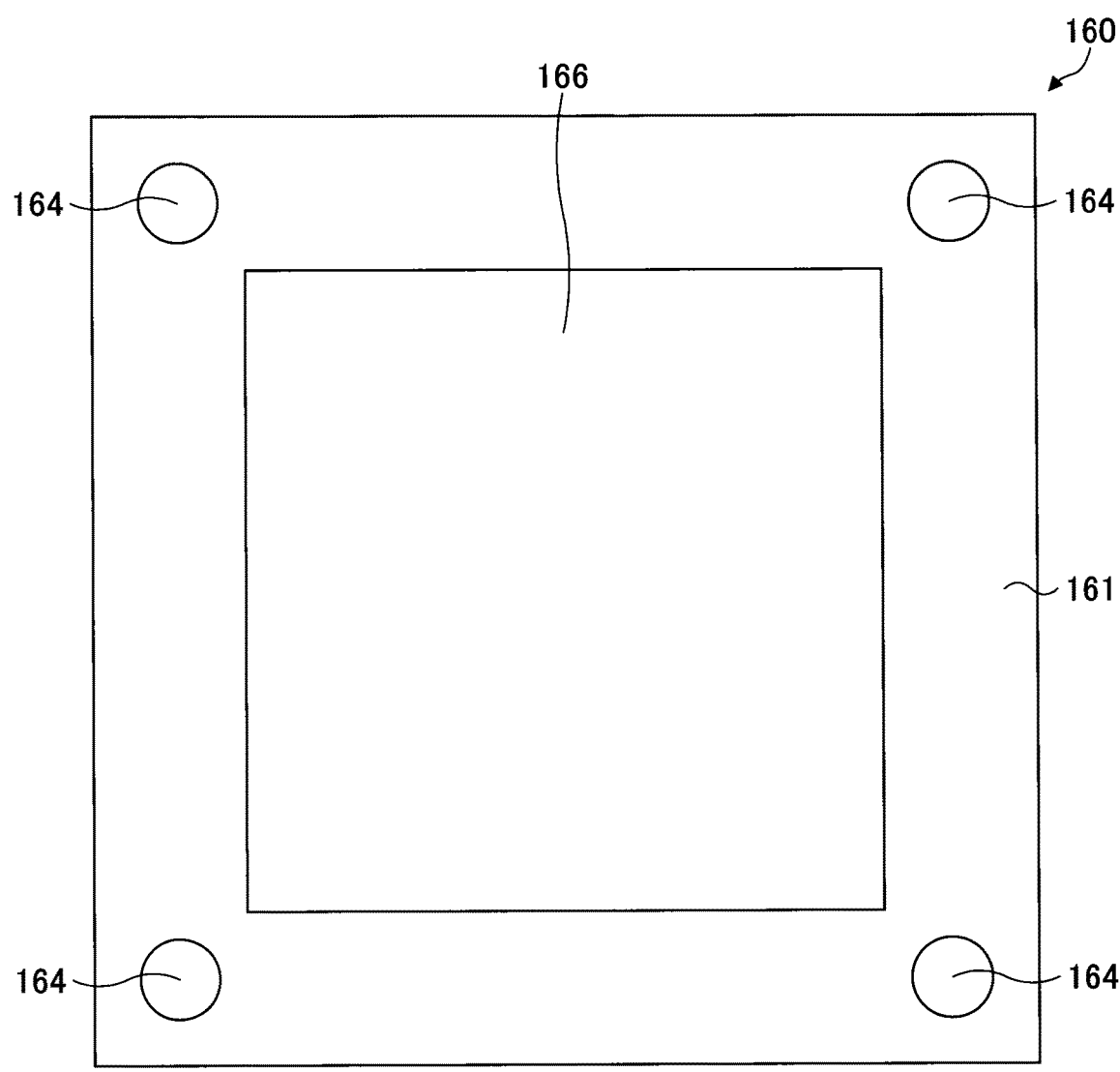

[Fig. 9]
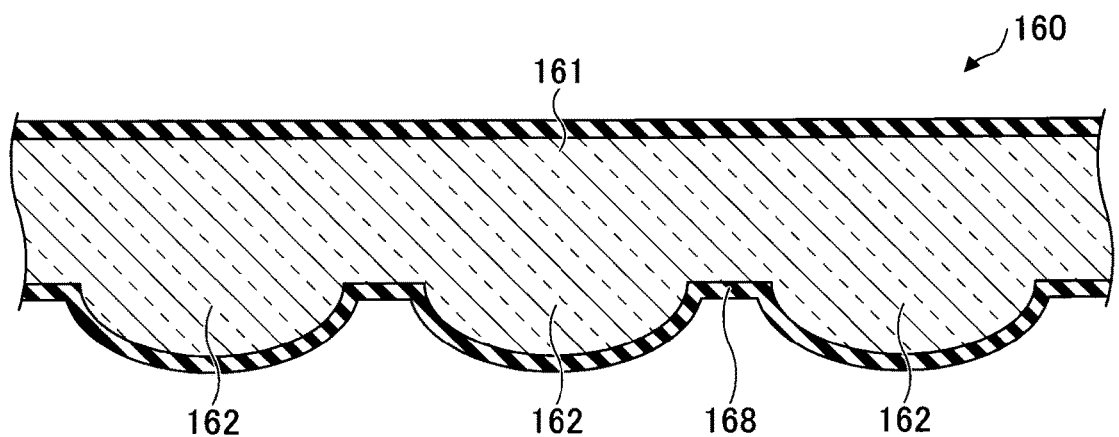
[Fig. 10A]
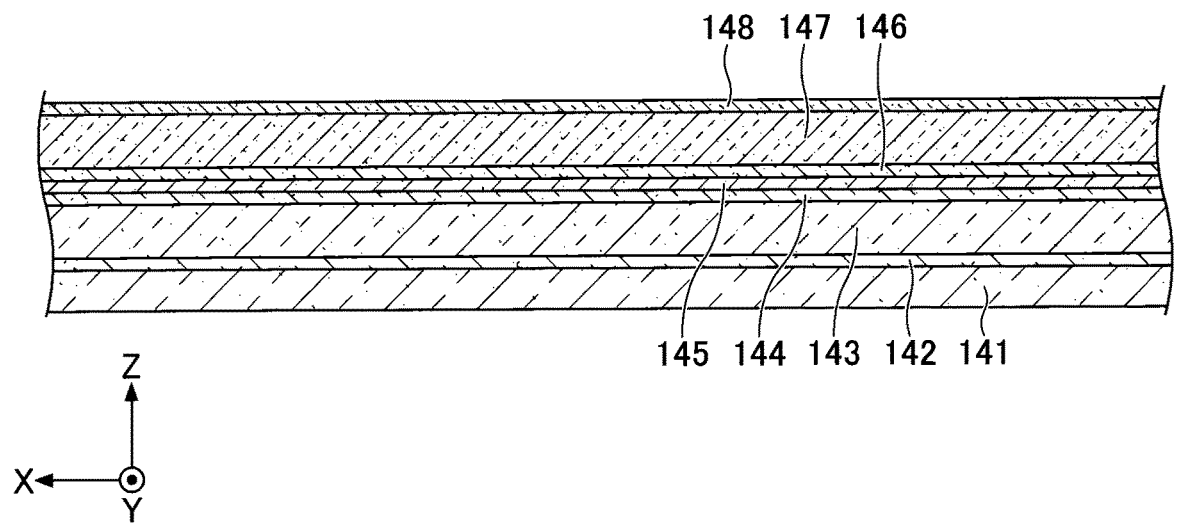

[Fig. 10B]
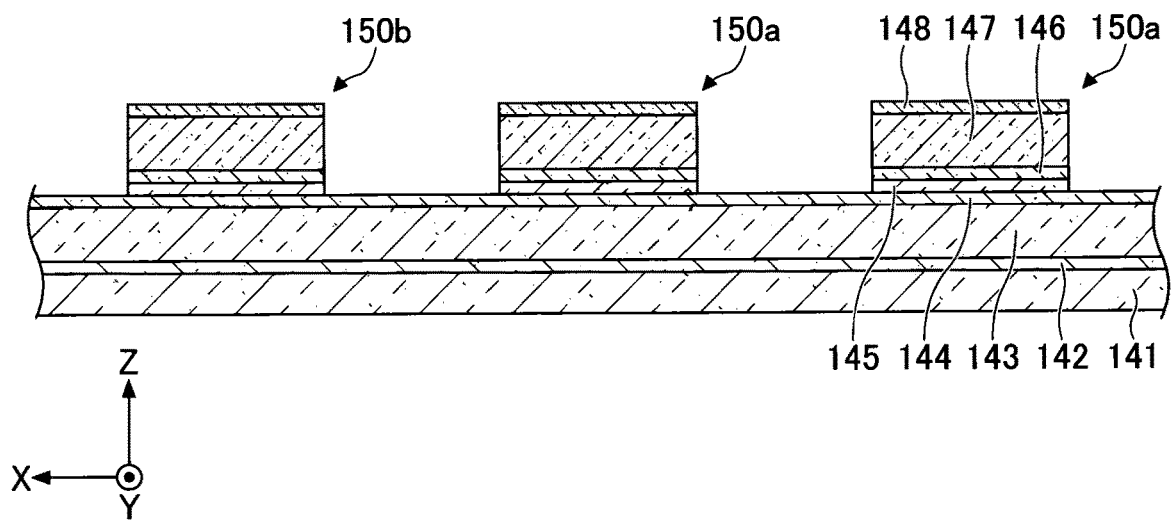
[Fig. 10C]
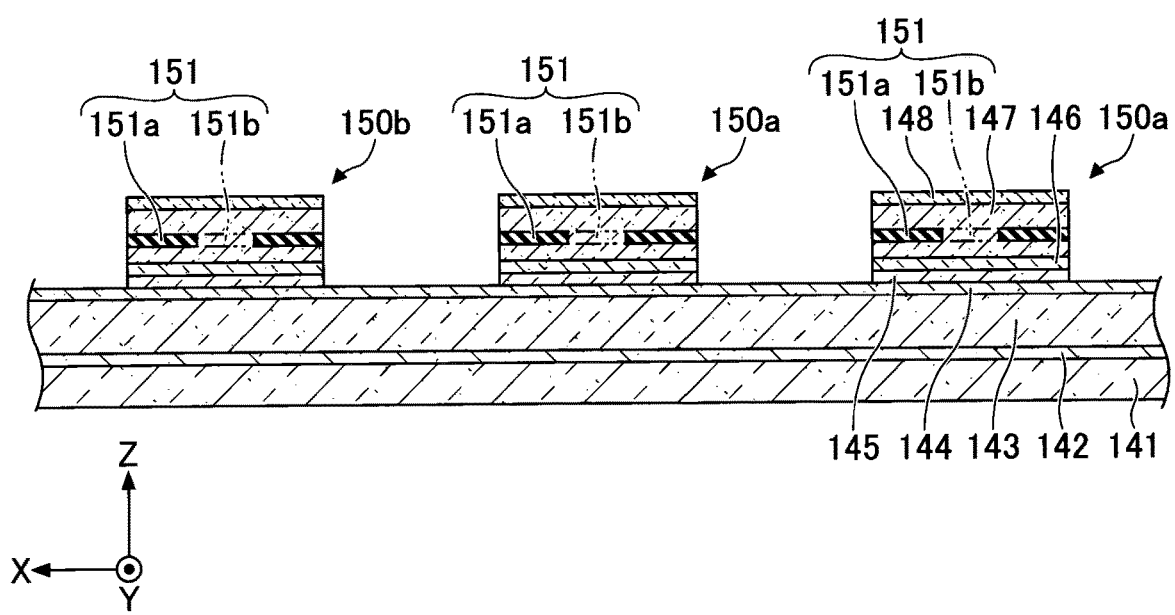

[Fig. 10D]
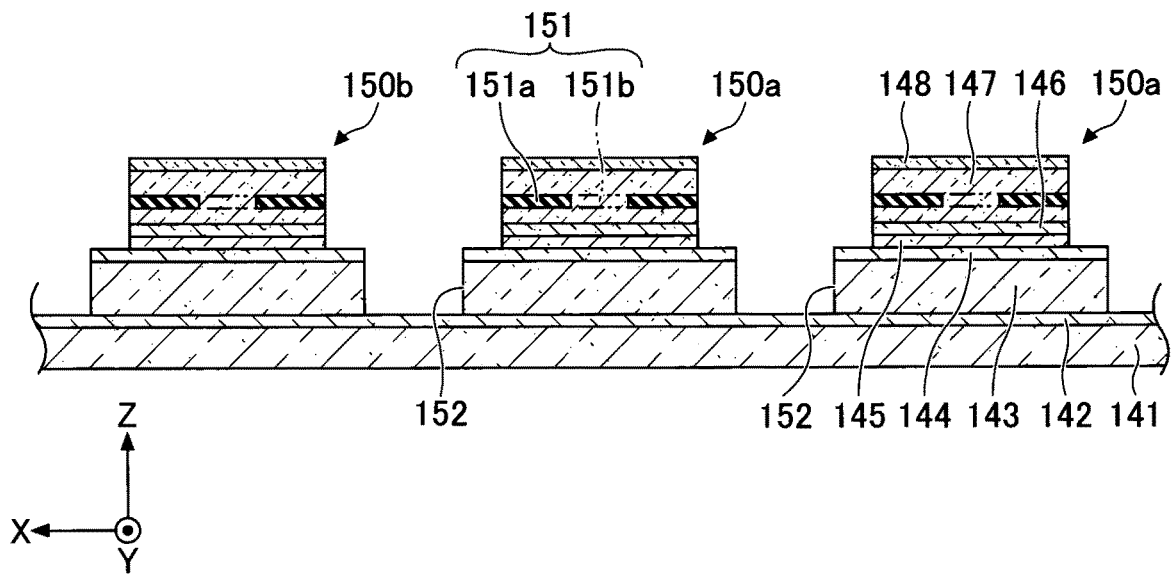
[Fig. 10E]
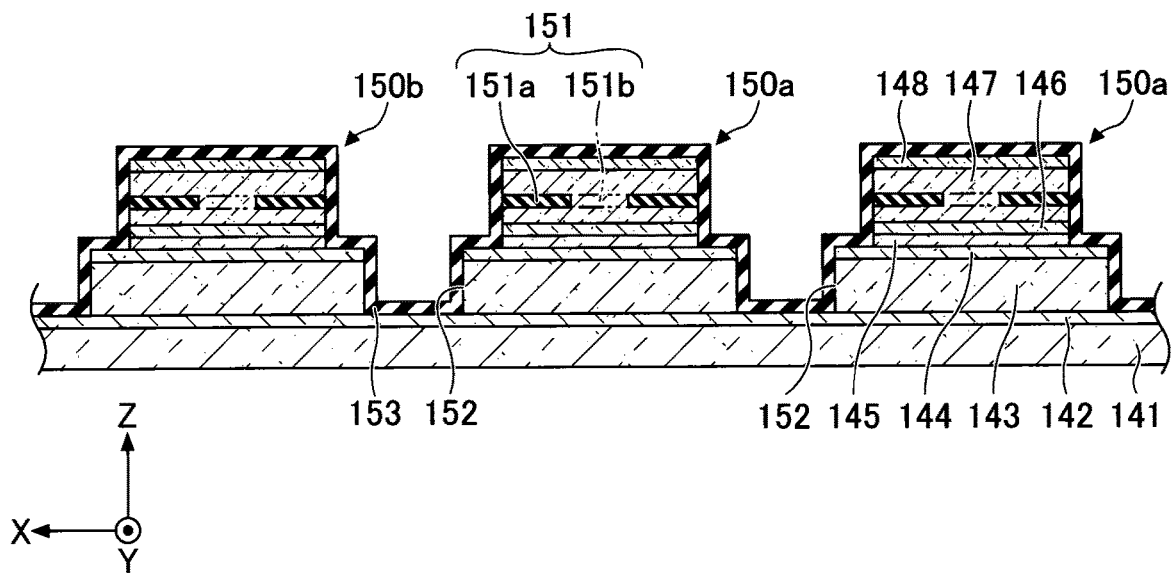

[Fig. 10F]
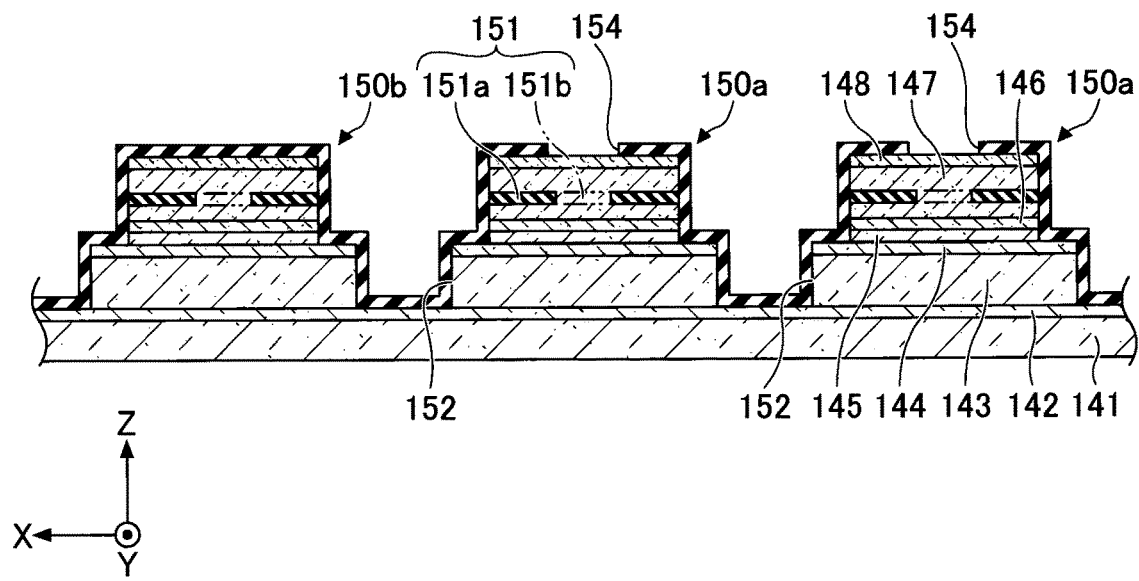
[Fig. 10G]
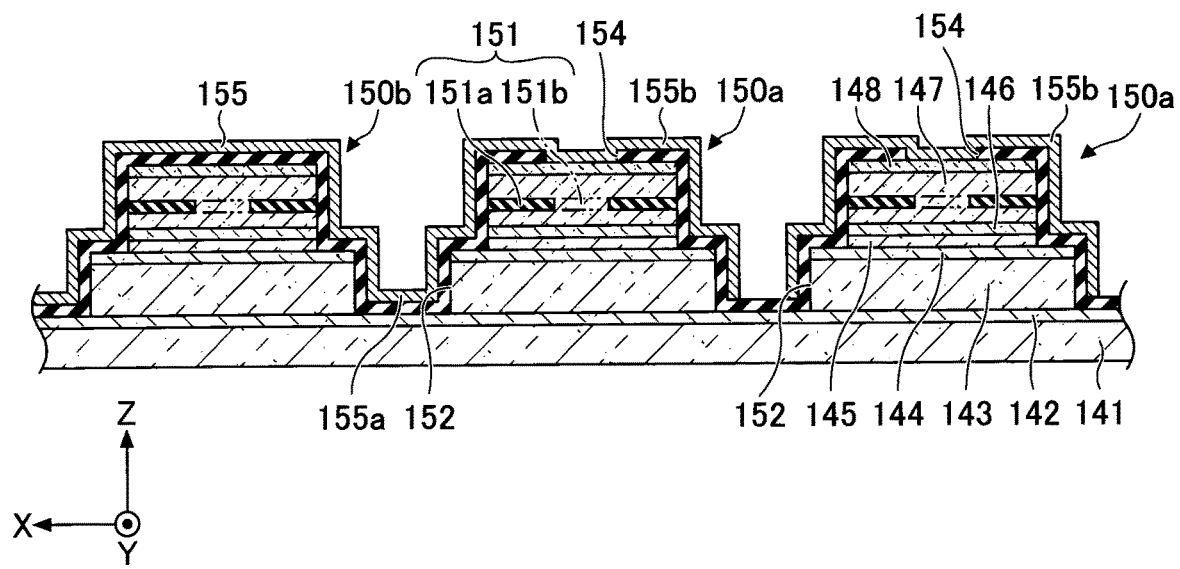

[Fig. 11A]
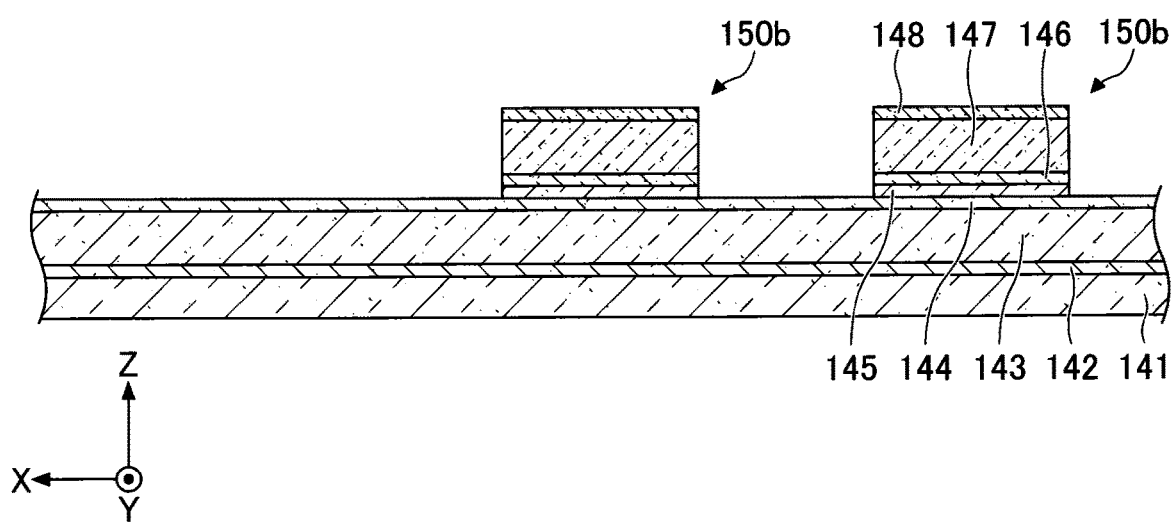
[Fig. 11B]
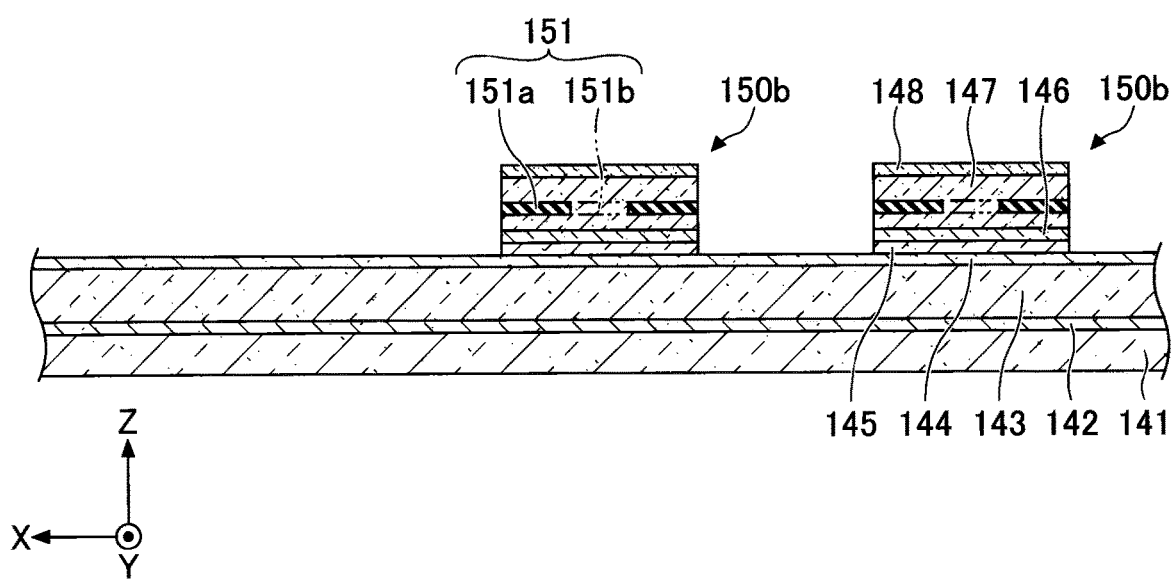

[Fig. 11C]
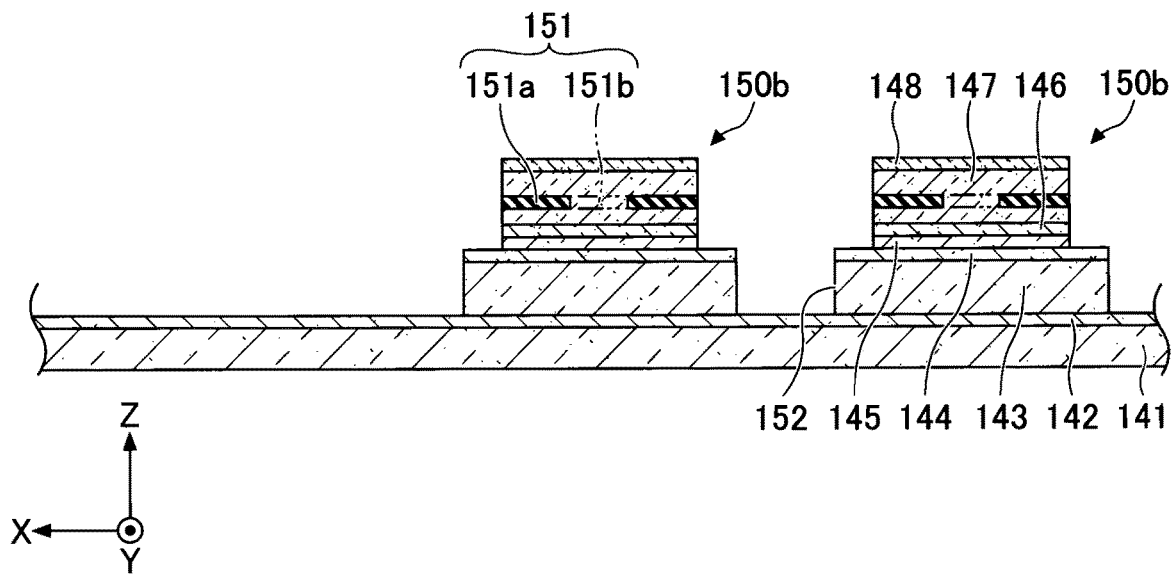
[Fig. 11D]
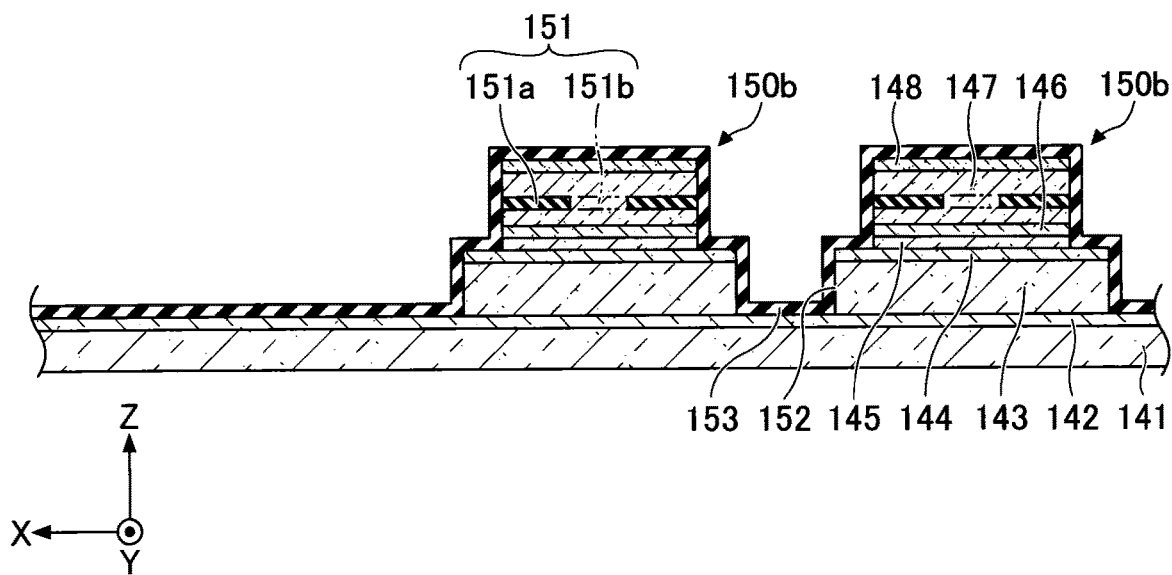

[Fig. 11E]
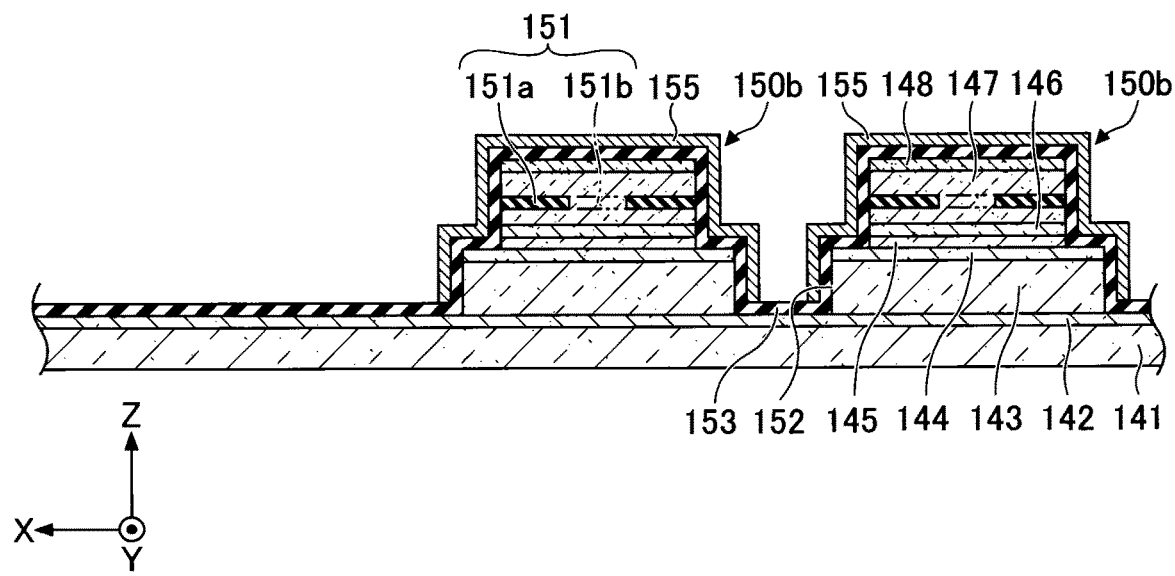
[Fig. 11F]
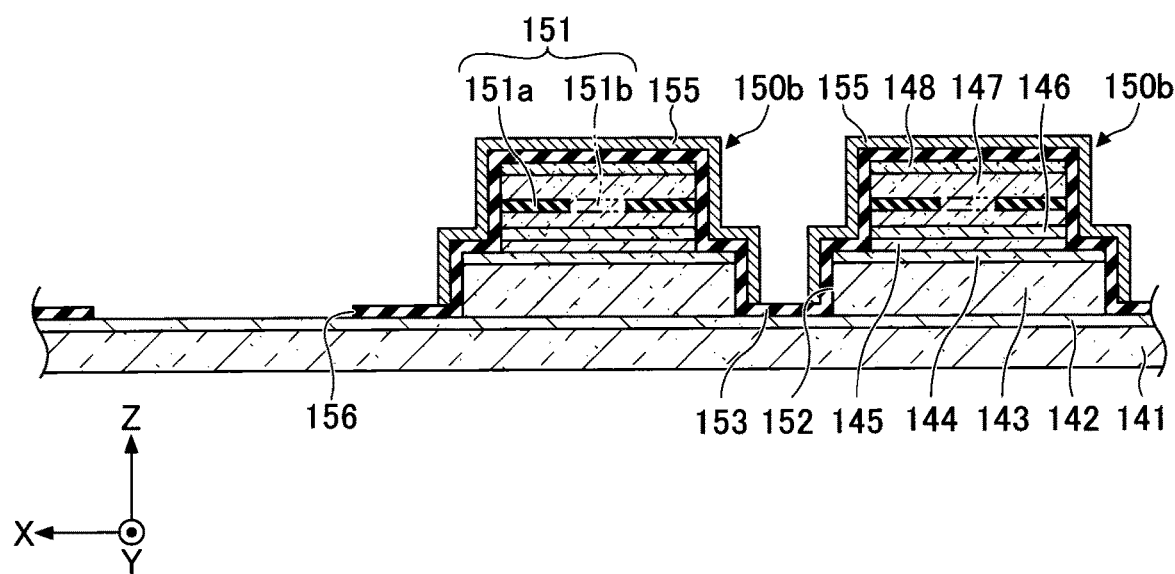

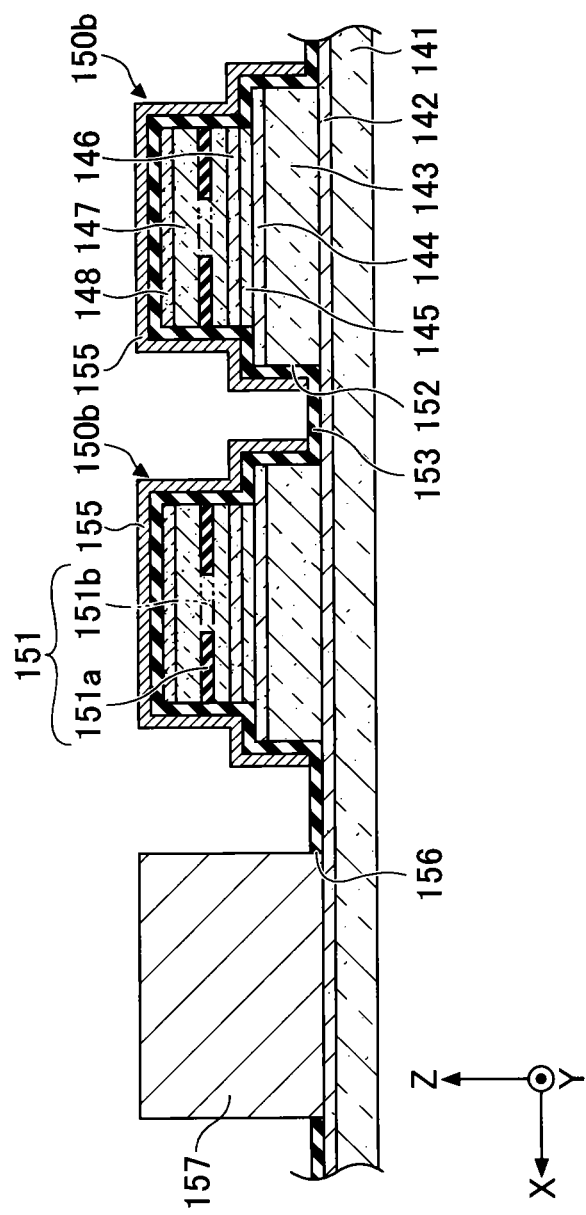
[Fig. 11G]

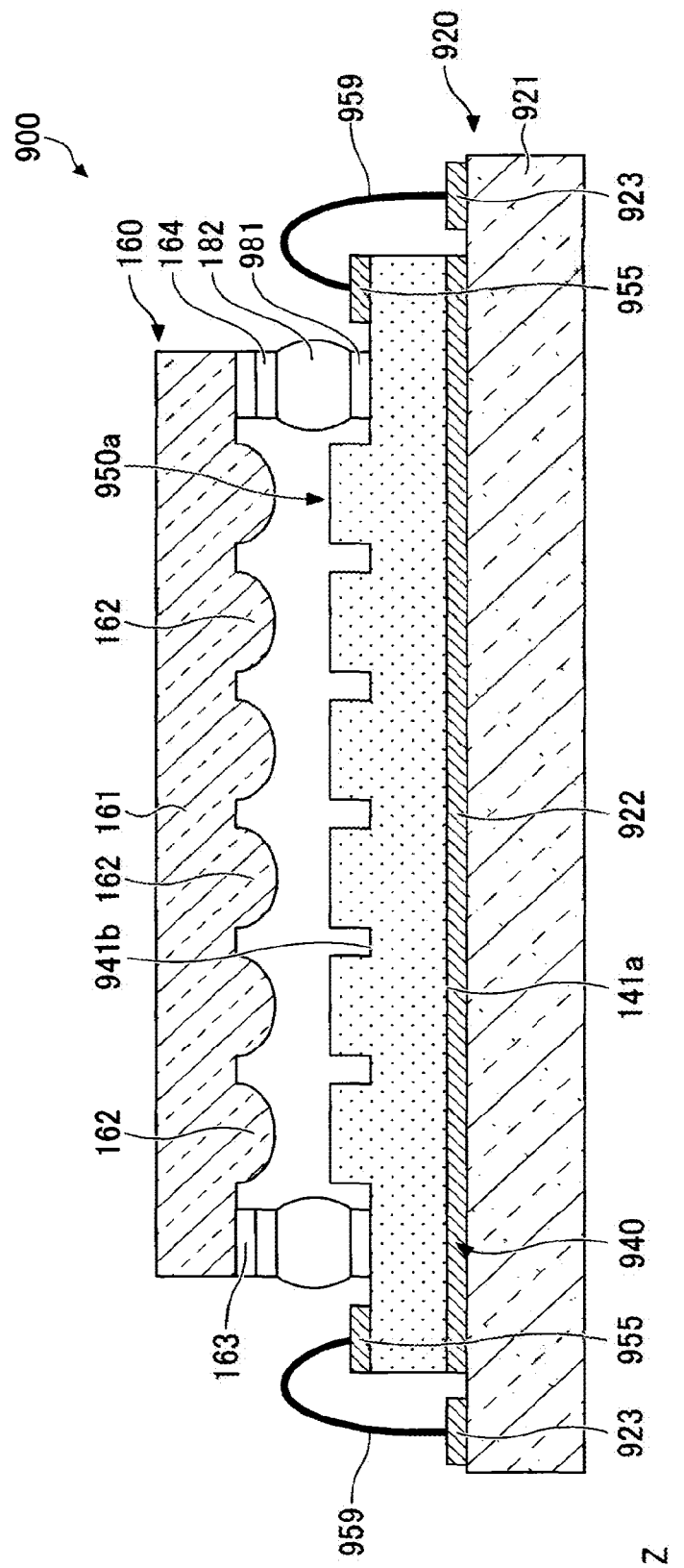
[Fig. 12]

[Fig. 13]
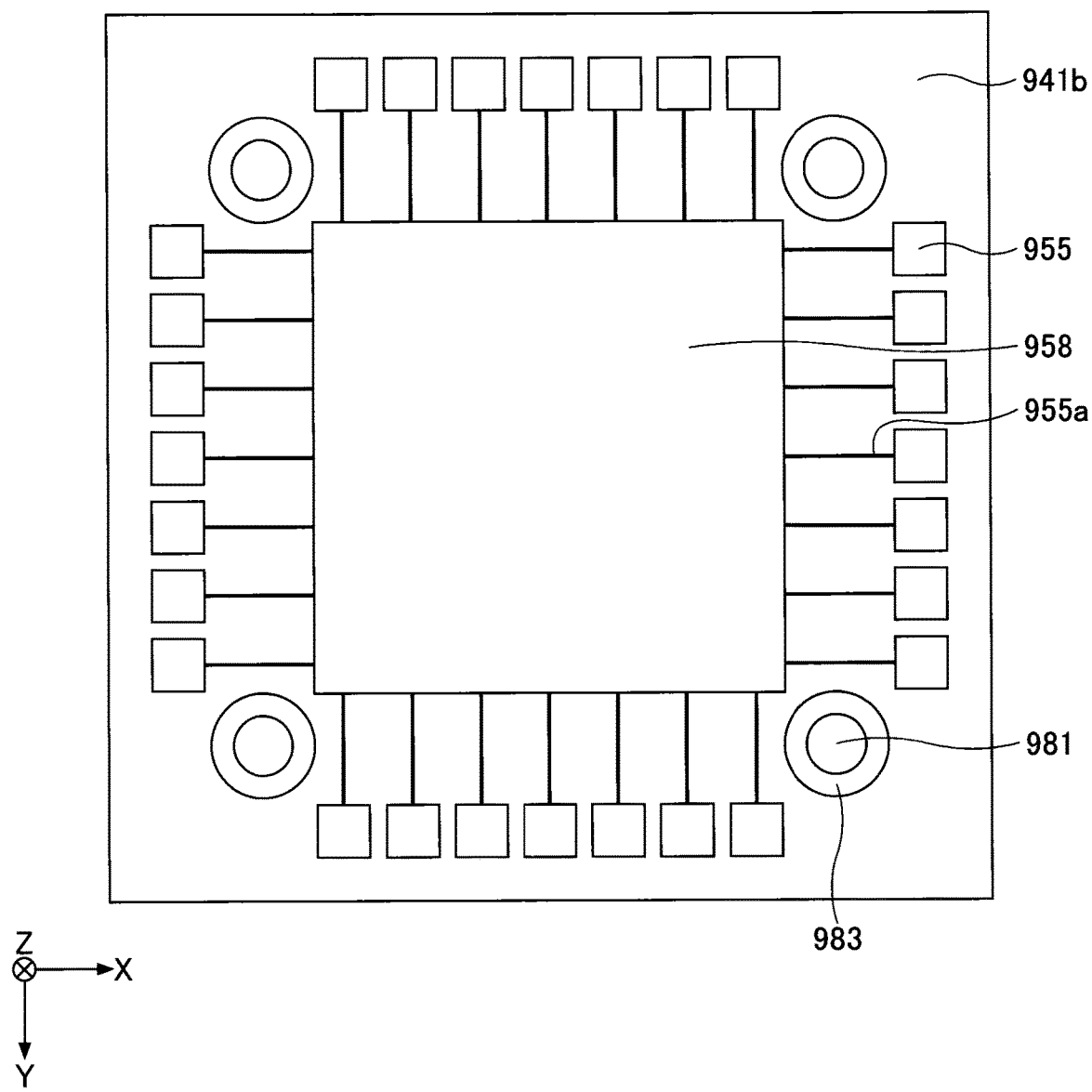

[Fig. 14]
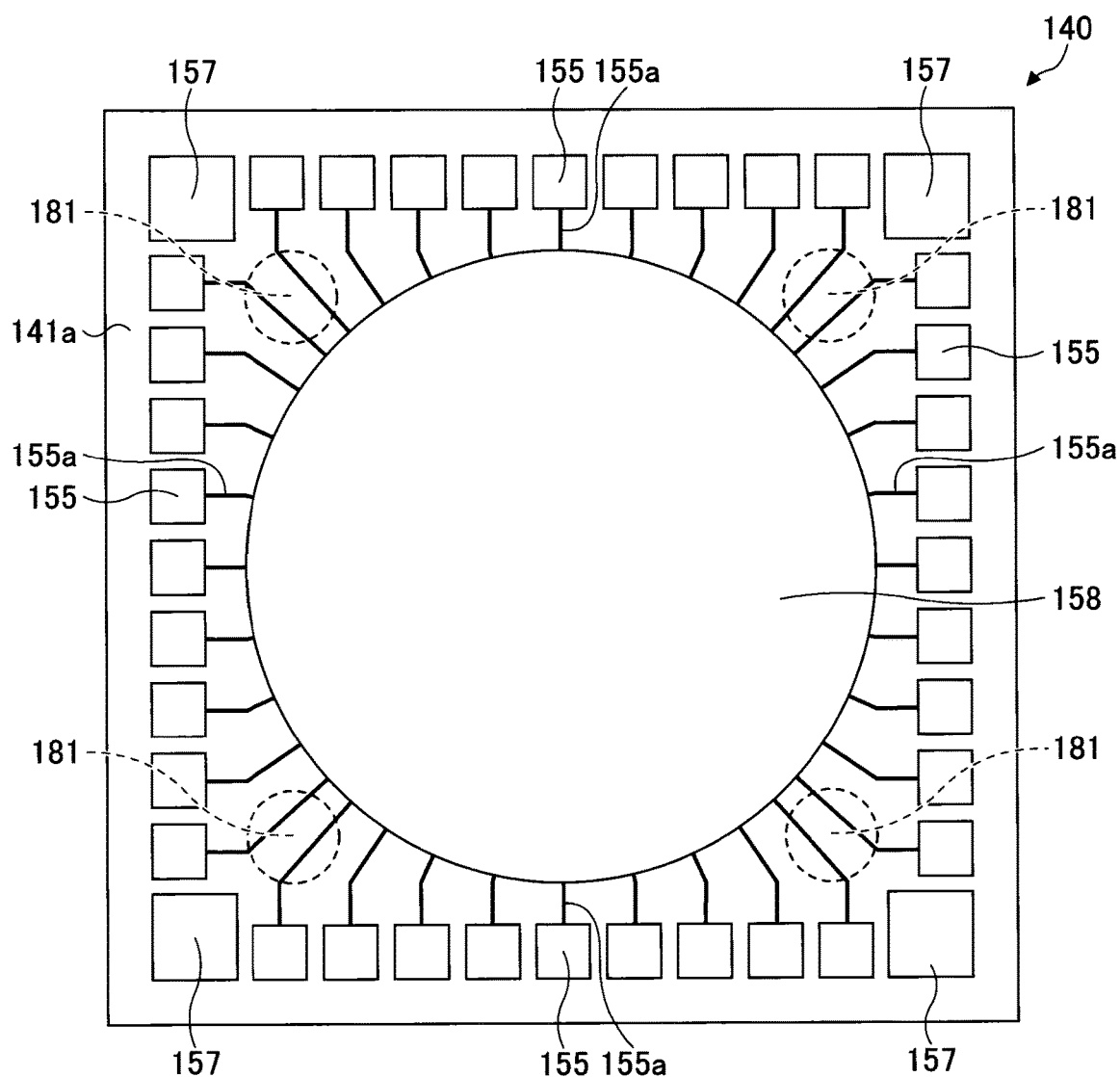

[Fig. 15]
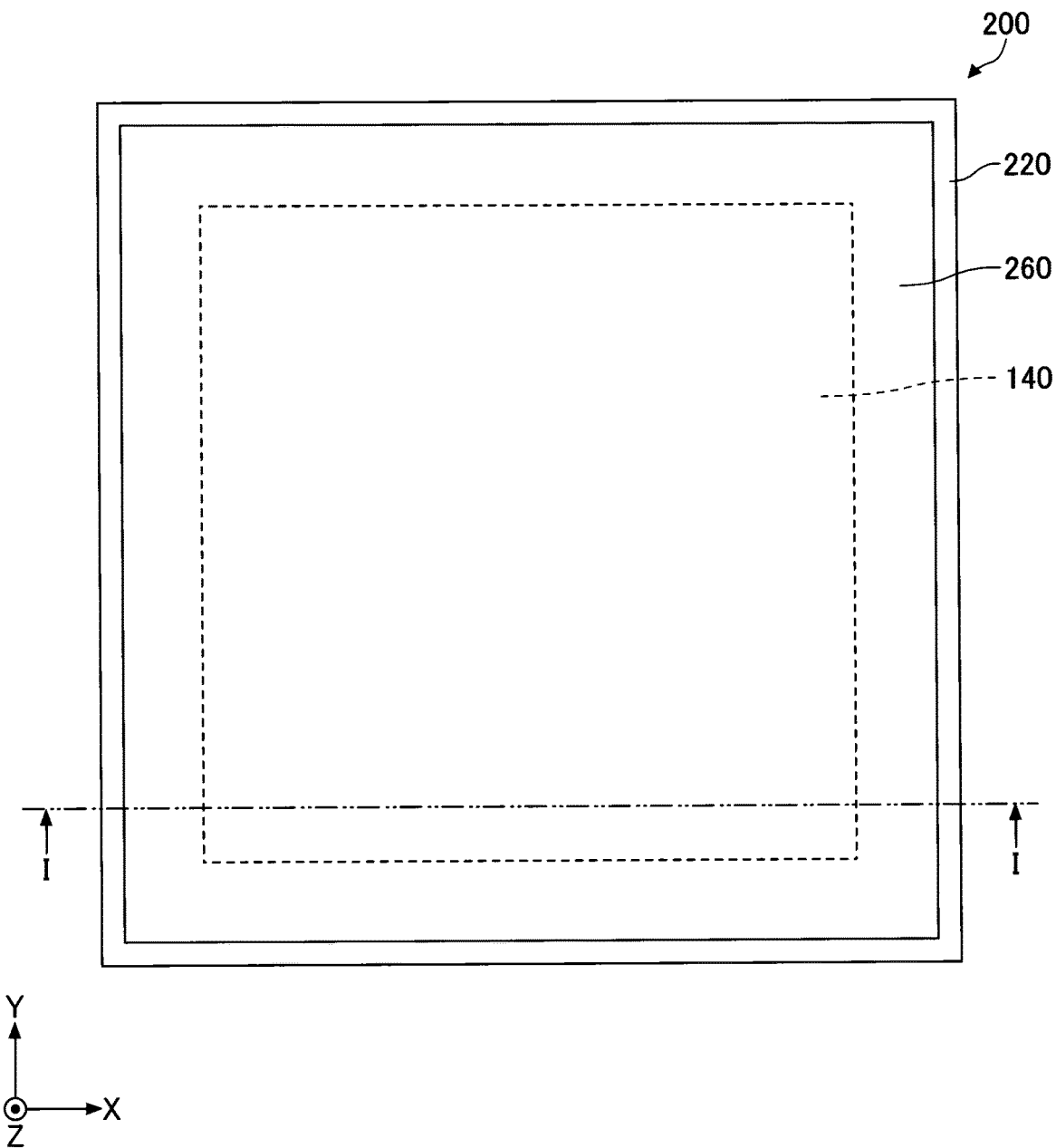

[Fig. 16]
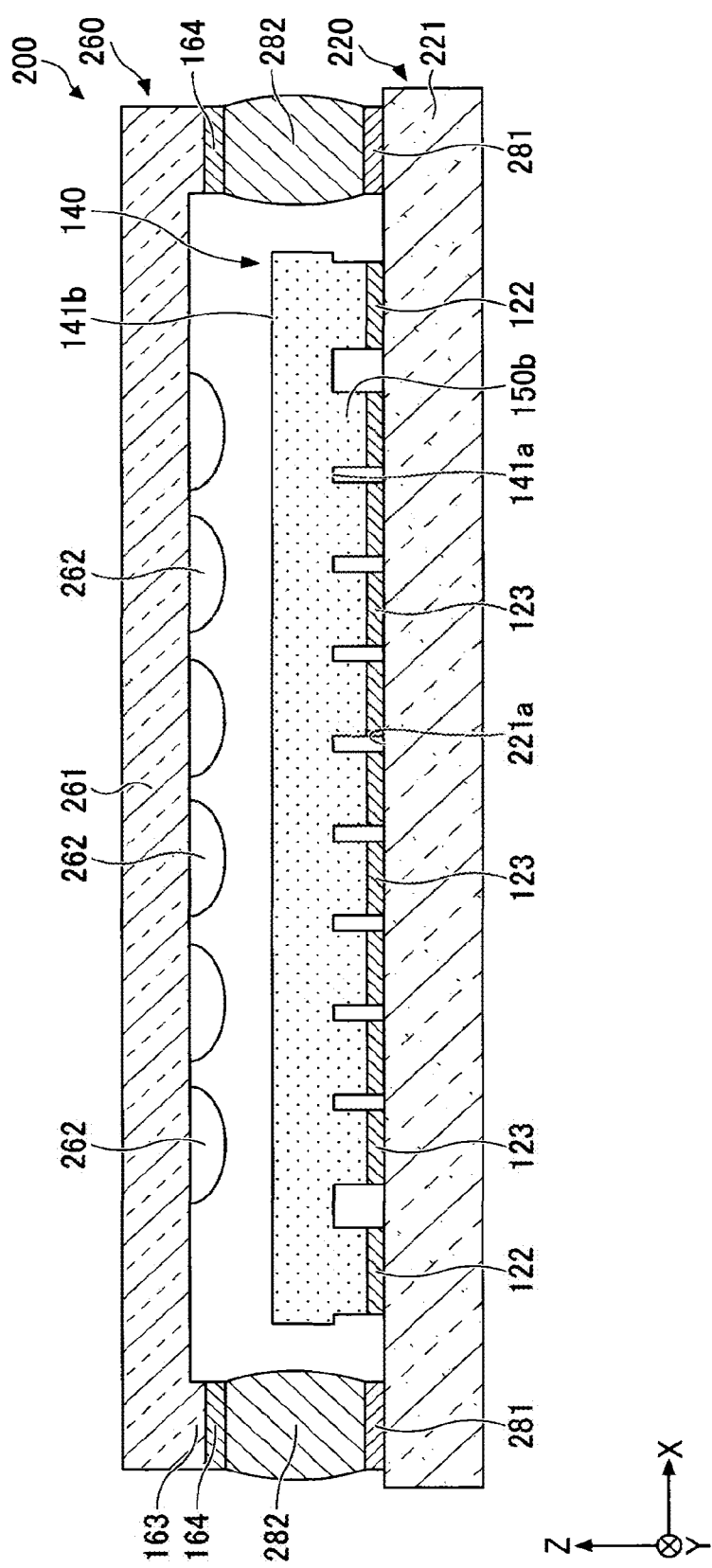

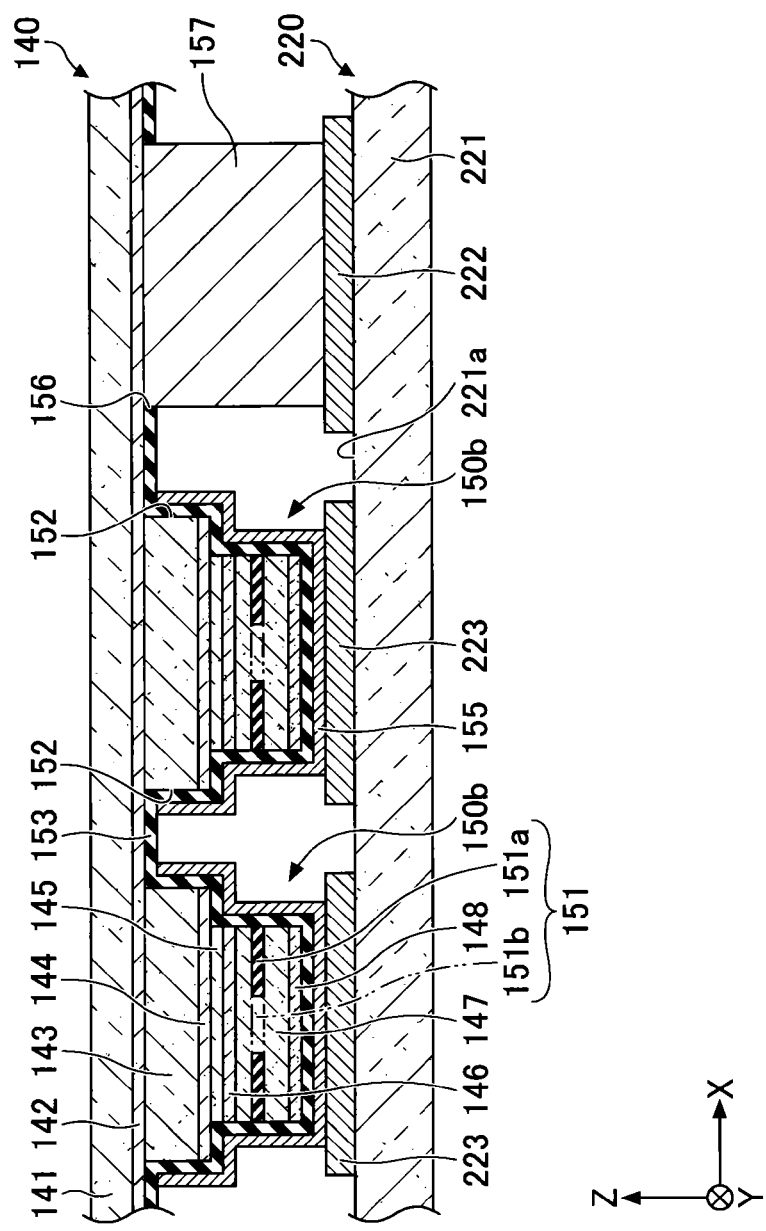
[Fig. 17]

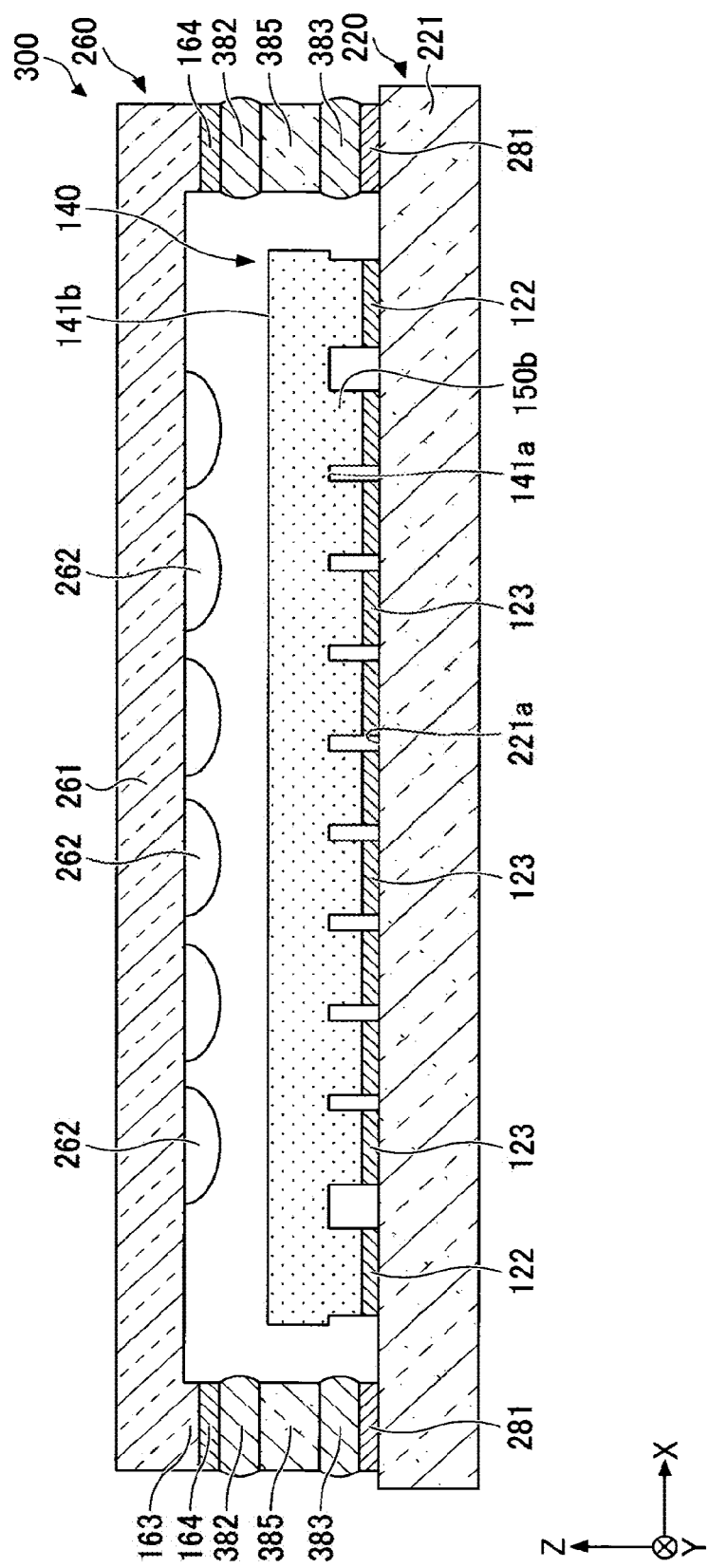
[Fig. 18]

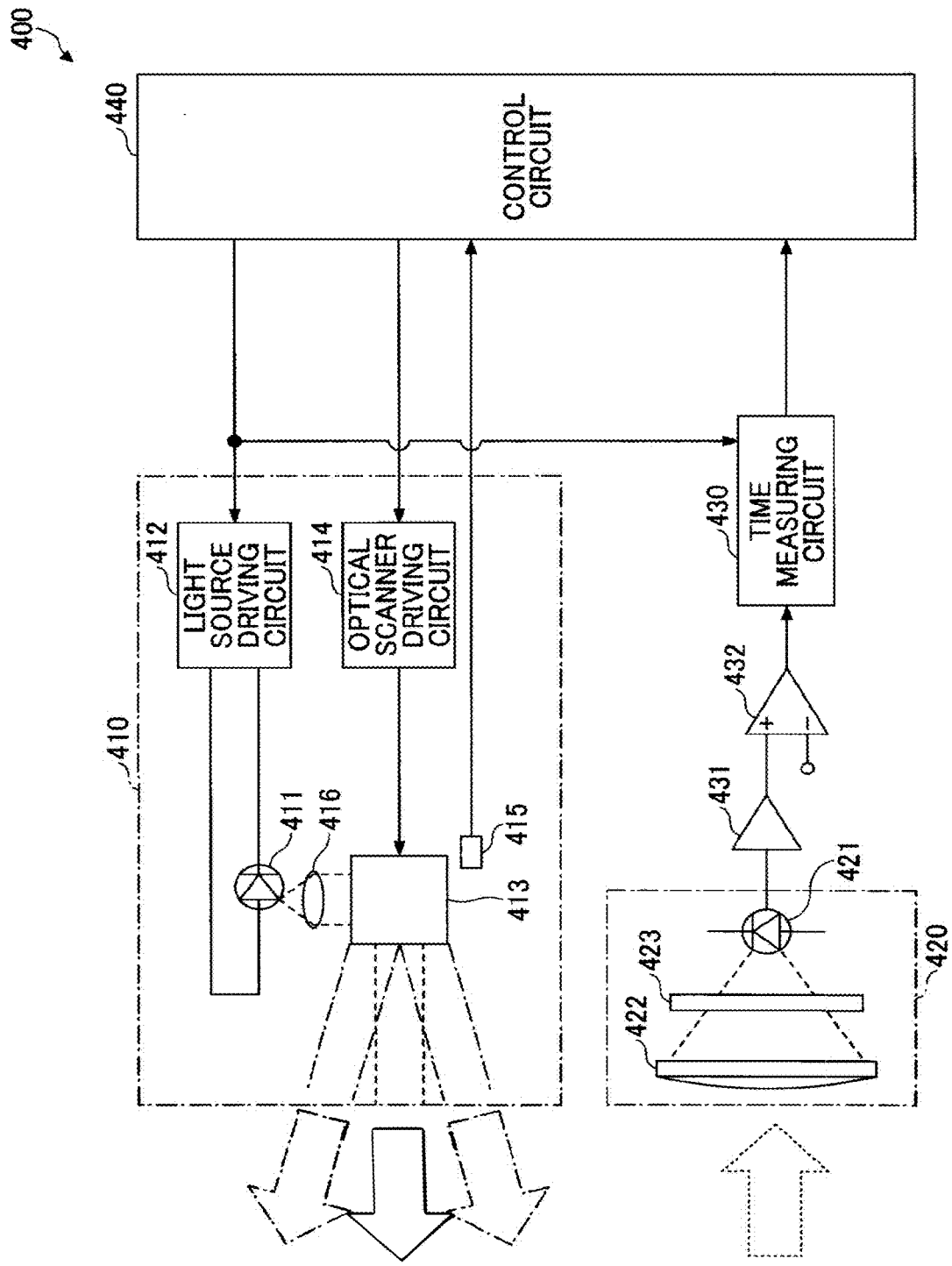
[Fig. 19]

SURFACE EMITTING LASER MODULE, OPTICAL DEVICE, AND SURFACE EMITTING LASER SUBSTRATE

TECHNICAL FIELD

The present invention relates to a surface emitting laser module, an optical device, and a surface emitting laser substrate.

BACKGROUND ART

A vertical cavity surface emitting laser (VCSEL) is a semiconductor laser that oscillates laser light in a direction perpendicular to the substrate. The VCSEL has features such as a lower threshold current, a single longitudinal mode oscillation, and a two dimensional array arrangement. The VCSEL is sometimes used in combination with a microlens array.

PTL 1 describes a device in which a surface formed with laser mesas (VCSEL elements) of a VCSEL device is oriented toward a microlens array, and the microlens array is mounted on this surface. In this photonic device, a plurality of electrode pads each of which is individually connected to a corresponding one of the VCSEL elements are provided on the surface formed with the VCSEL elements. These multiple electrode pads are provided at the outside of the part where the microlens array comes into contact with the VCSEL device, and are connected to the IC package by wire bonding.

According to the device described in PTL 1, the microlens array can be integrated into a VCSEL device.

SUMMARY OF INVENTION

Technical Problem

However, even though there is a demand for reducing the sizes of surface emitting laser substrates such as VCSEL devices, the structure described in PTL 1 cannot sufficiently meet the demand for the reduction of the sizes.

It is an object of the present invention to provide a surface emitting laser module, an optical device, and a surface emitting laser substrate of which the size can be further reduced.

Solution to Problem

According to an aspect of the technique of the present disclosure, a surface emitting laser module includes a base substrate, a surface emitting laser substrate mounted on the base substrate, the surface emitting laser substrate including a surface emitting laser element, and the surface emitting laser substrate having a first face facing the base substrate and a second face facing away from the base substrate, and an optical member facing the second face and including an optical element configured to receive light emitted from the second face of the surface emitting laser element. The surface emitting laser element includes a first semiconductor layer of a first conductivity type, a second semiconductor layer of a second conductivity type, a first electrode provided on the first face and connected to the first semiconductor layer, and a second electrode provided on the first face and connected to the second semiconductor layer. The base substrate has a third face facing the first face of the surface emitting laser substrate, and includes a third electrode provided on the third face and connected to the first electrode and a fourth electrode provided on the third face and connected to the second electrode.

Advantageous Effects of Invention

According to the technique of the present disclosure, the size of the surface emitting laser substrate can be further reduced.

BRIEF DESCRIPTION OF DRAWINGS

FIG. 1 is a top view illustrating a surface emitting laser module according to a first embodiment;

FIG. 2 is a cross-sectional view (part 1) illustrating the surface emitting laser module according to the first embodiment;

FIG. 3 is a cross-sectional view (part 2) illustrating the surface emitting laser module according to the first embodiment;

FIG. 4 is a cross-sectional view illustrating a part of FIG. 2 in an enlarged manner;

FIG. 5 is a cross-sectional view illustrating a part of FIG. 3 in an enlarged manner;

FIG. 6 is a bottom view illustrating a VCSEL chip according to the first embodiment;

FIG. 7 is a top view illustrating a VCSEL chip according to the first embodiment;

FIG. 8 is a bottom view illustrating an MLA according to the first embodiment;

FIG. 9 is a cross-sectional view illustrating the MLA according to the first embodiment;

FIG. 10A is a cross-sectional view (part 1) illustrating a method for forming the VCSEL chip according to the first embodiment;

FIG. 10B is a cross-sectional view (part 2) illustrating the method for forming the VCSEL chip according to the first embodiment;

FIG. 10C is a cross-sectional view (part 3) illustrating the method for forming the VCSEL chip according to the first embodiment;

FIG. 10D is a cross-sectional view (part 4) illustrating the method for forming the VCSEL chip according to the first embodiment;

FIG. 10E is a cross-sectional view (part 5) illustrating the method for forming the VCSEL chip according to the first embodiment;

FIG. 10F is a cross-sectional view (part 6) illustrating the method for forming the VCSEL chip according to the first embodiment;

FIG. 10G is a cross-sectional view (part 7) illustrating the method for forming the VCSEL chip according to the first embodiment;

FIG. 11A is a cross-sectional view (part 8) illustrating the method for forming the VCSEL chip according to the first embodiment;

FIG. 11B is a cross-sectional view (part 9) illustrating the method for forming the VCSEL chip according to the first embodiment;

FIG. 11C is a cross-sectional view (part 10) illustrating the method for forming the VCSEL chip according to the first embodiment;

FIG. 11D is a cross-sectional view (part 11) illustrating the method for forming the VCSEL chip according to the first embodiment;

FIG. 11E is a cross-sectional view (part 12) illustrating the method for forming the VCSEL chip according to the first embodiment;

FIG. 11F is a cross-sectional view (part 13) illustrating the method for forming the VCSEL chip according to the first embodiment;

FIG. 11G is a cross-sectional view (part 14) illustrating the method for forming the VCSEL chip according to the first embodiment;

FIG. 12 is a cross-sectional view illustrating a surface emitting laser module according to a reference example;

FIG. 13 is a top view illustrating a VCSEL chip according to the reference example;

FIG. 14 is a bottom view illustrating a VCSEL chip according to a modification of the first embodiment;

FIG. 15 is a top view illustrating a surface emitting laser module according to a second embodiment;

FIG. 16 is a cross-sectional view illustrating a surface emitting laser module according to the second embodiment;

FIG. 17 is a cross-sectional view illustrating a portion of FIG. 16 in an enlarged manner;

FIG. 18 is a cross-sectional view illustrating a surface emitting laser module according to a modification of the second embodiment; and FIG. 19 is a drawing illustrating a distance measuring device according to a third embodiment.

DESCRIPTION OF EMBODIMENTS

Hereinafter, the embodiments of the present disclosure will be specifically described with reference to the accompanying drawings. In this specification and drawings, constituent elements having substantially the same functional configurations may be denoted with the same reference numerals and redundant description thereabout may be omitted. In the present disclosure, in explanations about arrangements of components, with regard to a substrate, a direction away from the substrate may be referred to as an upward direction. For example, a film formed to be in contact with a lower surface of the substrate may be referred to as a film formed on the lower surface of the substrate.

First Embodiment

First, the first embodiment will be explained. The first embodiment relates to a surface emitting laser module. FIG. 1 is a top view illustrating the surface emitting laser module according to the first embodiment. FIG. 2 and FIG. 3 are cross-sectional views illustrating the surface emitting laser module according to the first embodiment. FIG. 2 corresponds to a cross-sectional view taken along line I-I of FIG. 1. FIG. 3 corresponds to a cross-sectional view taken along line II-II of FIG. 1. FIG. 4 is a cross-sectional view illustrating a part of FIG. 2 in an enlarged manner. FIG. 5 is a cross-sectional view illustrating a part of FIG. 3 in an enlarged manner. FIG. 6 is a bottom view illustrating a vertical cavity surface emitting laser (VCSEL) chip according to the first embodiment. FIG. 7 is a top view illustrating the VCSEL chip according to the first embodiment. The cross section of the VCSEL chip in FIG. 4 corresponds to the cross section taken along line III-III of FIG. 6. The cross section of the VCSEL chip in FIG. 5 corresponds to the cross section taken along line IV-IV of FIG. 6. FIG. 8 is a bottom view illustrating a micro lens array (MLA) according to the first embodiment. FIG. 9 is a cross-sectional view illustrating the MLA according to the first embodiment.

As illustrated in FIG. 1 to FIG. 5, the surface emitting laser module 100 according to the first embodiment includes a base substrate 120, a VCSEL chip 140 that is mounted on the base substrate 120 and that includes VCSEL elements, and a MLA 160 including microlenses 162 which receive light exiting from the VCSEL elements. The VCSEL element is an example of a surface emitting laser element. The VCSEL chip 140 is an example of a surface emitting laser substrate. The microlens 162 is an example of an optical element. The MLA 160 is an example of an optical member. That is, the VCSEL chip 140 is an embodiment of a surface emitting laser substrate.

In the following description, unless otherwise specified, a direction in which the VCSEL chip 140 is located with respect to the base substrate 120 is referred to as upward, and a direction in which the base substrate 120 is located with respect to the VCSEL chip 140 is referred to as downward. However, the surface emitting laser module 100 can be used upside down, and can be placed at any angle. Also, a top view refers to viewing a target object from a direction normal to an upper face 141b of the VCSEL chip 140. A planar shape refers to a shape of a target object viewed from the direction normal to the face 141b of the VCSEL chip 140.

In each drawing, the direction normal to the face 141b of the VCSEL chip 140 is defined as a direction Z. In the top view, a direction parallel to one side of the face 141b of the VCSEL chip 140 is defined as a direction X. A direction perpendicular to the direction X and the direction Z is defined as a direction Y.

<Structure of VCSEL Chip 140>

Here, the structure of the VCSEL chip 140 will be described. In the explanation about the structure of the VCSEL chip 140 and the explanation about the method for forming the VCSEL chip 140 explained later, a direction (direction −Z in FIG. 2 to FIG. 5) in which the base substrate 120 is located with respect to the VCSEL chip 140 is defined as an upper side.

As illustrated in FIG. 6, the planar shape of the VCSEL chip 140 is, for example, a quadrangle, and a light emitting element unit 158 of which the planar shape is a quadrangle is provided at substantially the center of a face 141a facing the base substrate 120. The face 141a is an example of a first face. The face 141b is an example of a second face. In the light emitting element unit 158, a plurality of VCSEL elements 159 are arranged in a manner of an array. For example, a total of 36 VCSEL elements 159 are arranged in 6 by 6 grids in the direction X and the direction Y. Each of the VCSEL elements 159 is monolithically fabricated on a substrate 141 such as an n-GaAs substrate, and all of the VCSEL elements 159 have the same film configuration. Each of the VCSEL elements 159 is, for example, a surface emitting laser with an oscillation wavelength of 940 nm.

The first electrodes 157 are provided at the four corners of the face 141a at the outside of the light emitting element unit 158. The face 141a is provided with 36 second electrodes 155 in total with 9 second electrodes 155 being arranged on each side of the light emitting element unit 158. The four first electrodes 157 are connected commonly to the n-side electrodes of the 36 VCSEL elements 159. Each of the 36 second electrodes 155 is individually connected to the p-side electrode of a corresponding one of the 36 VCSEL elements 159 through an interconnect 155a. The four corners of the face 141a mean the vicinities of the corners of the face 141a, and the first electrodes 157 are not necessarily required to be in contact with the edge of the face 141a.

As illustrated in FIG. 7, the fixing patterns 181 are formed as adhesion fixing regions at the four corners of a face 141b of the VCSEL chip 140 facing the MLA 160. For example, the fixing pattern 181 has a pattern of a stacked film in which titanium (Ti), platinum (Pt), and gold (Au) are stacked in this order from the face 141b. The adhesive fixing region is an example of a bonding region.

For example, the VCSEL element 159 includes, on a substrate 141 such as an n-GaAs substrate and the like, a contact layer 142, a semiconductor multilayer reflector 143, a spacer layer 144, an active layer 145, a spacer layer 146, a semiconductor multilayer reflector 147, a selectively oxidized layer 151, and a contact layer 148. The selectively oxidized layer 151 includes an oxidized area 151a and a non-oxidized area 151b.

The contact layer 142 is formed on the substrate 141. The contact layer 142 is, for example, an n-GaAs layer.

The semiconductor multilayer reflector 143 is formed on the contact layer 142. The semiconductor multilayer reflector 143 includes, for example, low refractive index layers made of n-$Al_{0.9}Ga_{0.1}As$ and high refractive index layers made of n-$Al_{0.2}Ga_{0.8}As$. For example, the semiconductor multilayer reflector 143 includes 30 pairs of the low refractive index layers and the high refractive index layers.

Between the refractive index layers of the semiconductor multilayer reflector 143, there is provided a composition gradient layer having a thickness of, for example, 20 nm, in which the composition is gradually changed from one composition to another composition in order to reduce electrical resistance. Where the oscillation wavelength is denoted as $\lambda$, the film thickness of each of the refractive index layers, including ½ of the adjacent composition gradient layer, is configured to have an optical thickness of $\lambda/4$. It should be noted that, where the optical thickness is $\lambda/4$, the actual thickness D of the layer is $\lambda/4n$ (where n denotes the refractive index of the medium of the layer).

The spacer layer 144 is formed on the semiconductor multilayer reflector 143. The spacer layer 144 is, for example, a non-doped AlGaInP layer.

The active layer 145 is formed on the spacer layer 144. The active layer 145 is an active layer having a triple quantum well structure having, for example, three quantum well layers and four barrier layers. For example, the quantum well layers are InGaAs layers and the barrier layers are AlGaAs layers.

The spacer layer 146 is formed on the active layer 145. The spacer layer 146 is, for example, a non-doped AlGaInP layer.

A portion including the spacer layer 144, the active layer 145, and the spacer layer 146 is also referred to as a resonator structure (resonator area), and is configured to have an optical thickness of 1 wavelength ($\lambda$), including ½ of the adjacent composition position gradient layer. The active layer 145 is provided at the center of the resonator structure, which is a position corresponding to the antinode in the standing wave distribution of the electric field, so that a high stimulated emission probability can be obtained.

The semiconductor multilayer reflector 147 is formed on the spacer layer 146. For example, the semiconductor multilayer reflector 147 includes low refractive index layers made of p-$Al_{0.9}Ga_{0.1}As$ and high refractive index layers made of p-$Al_{0.2}Ga_{0.8}As$. For example, the semiconductor multilayer reflector 147 includes 20 pairs of the low refractive index layers and the high refractive index layers.

Between the refractive index layers of the semiconductor multilayer reflector 147, there is provided a composition gradient layer having a thickness of, for example, 20 nm, in which the composition is gradually changed from one composition to another composition in order to reduce electrical resistance. Where the oscillation wavelength is denoted as $\lambda$, the film thickness of each of the refractive index layers, including ½ of the adjacent composition gradient layer, is configured to have an optical thickness of $\lambda/4$.

In the semiconductor multilayer reflector 147, a selectively oxidized layer 151 made of, for example, p-AlAs is inserted with a thickness of, for example, 30 nm. The insertion position of the selectively oxidized layer 151 can be, for example, within the second pair, counted from the spacer layer 146, of the high refractive index layer and the low refractive index layer. It should be noted that the selectively oxidized layer 151 may include layers such as a composition gradient layer and an intermediate layer disposed above and below the selectively oxidized layer 151, and here, the layers that are actually oxidized are collectively referred to as a selectively oxidized layer.

The contact layer 148 is formed on the semiconductor multilayer reflector 147. The contact layer 148 is, for example, a p-GaAs layer.

Mesas 150a corresponding to the VCSEL elements 159 are formed in the light emitting element unit 158 by removing parts of the contact layer 148, the semi-conductor multilayer reflector 147, the spacer layer 146, and the active layer 145 by etching. Further, mesas 150b are formed at positions corresponding to the second electrodes 155 at the outside of the light emitting element unit 158. The spacer layer 144 and the semiconductor multilayer reflector 143 are divided between the adjacent mesa 150a, and a groove 152 reaching the contact layer 142 is formed.

An insulating layer 153 covering the mesas 150a and 150b is formed. For example, SiN, SiON, $SiO_2$ or the like can be used as a material of the insulating layer 153. In the insulating layer 153, an opening portion 154 exposing a part of the contact layer 148 of each of the mesas 150a is formed. The opening portion 154 is formed at a position overlapping the non-oxidized area 151b in the top view.

A p-side electrode 155b electrically connected to the contact layer 148 through the opening portion 154 is formed on the insulating layer 153 independently for each of the mesas 150a. Each of the p-side electrodes 155b is individually connected to a corresponding one of the second electrodes 155 via an interconnect 155a. For example, the p-side electrode 155b, the interconnect 155a, and the second electrode 155 are configured as a stacked film in which Ti, Pt, and Au are stacked in order from the side of the insulating layer 153.

For the mesa 150b, an opening portion is not formed in the insulating layer 153, and the contact layer 148 in the mesa 150b is electrically insulated from the second electrode 155. Therefore, no current flows in the mesa 150b.

Opening portions 156 are formed at the four corners of the insulating layer 153 at the outside of the light emitting element unit 158 so as to expose parts of the contact layer 142. The first electrodes 157 are formed to be electrically connected to the contact layer 142 through the opening portions 156. The first electrodes 157 also serve as the n-side electrode of each of the VCSEL chips 140. For example, the first electrode 157 has a stacked film in which gold germanium alloy (AuGe), nickel (Ni), and gold (Au) are stacked in order from the side of the contact layer 142.

On a face 121a of the base substrate 120 facing the face 141a, third electrodes 122 bonded to the first electrodes 157 and fourth electrodes 123 bonded to the second electrodes 155 are formed on the substrate 121. The face 121a is an example of a third face. For example, the number of the third electrodes 122 is 4, and the number of the fourth electrodes 123 is 36. The VCSEL chip 140 is flip-chip mounted on the base substrate 120. The third electrodes 122 and the fourth electrodes 123 are, for example, Au plating films having a thickness of 2 µm.

<Structure of MLA 160>

Hereinafter, the MLA 160 will be explained.

The MLA 160 has a transparent substrate 161 made of, for example, quartz glass. A lens area 166 is provided at substantially the central portion of the face of the MLA 160 facing the VCSEL chip 140. For example, in the lens area 166, a total of 36 microlenses 162 are arranged in a manner of an array at positions corresponding to the respective VCSEL elements 159. Each of the microlenses 162 is designed to perform a desired beam shaping for the radiation pattern of the VCSEL element 159. For example, the lens diameter is 45 µm and the focal length is 70 µm.

Anti-reflection films 168 are formed on both sides of the MLA 160. The anti-reflection film 168 is, for example, a stacked film in which $HfO_2$ and $SiO_2$ are stacked in order from the side of the transparent substrate 161, and is designed to have a transmittance of 99% or more for light in a predetermined wavelength region including 940 nm, i.e., the oscillation wavelength of VCSEL element 159.

Leg portions 163 for defining the distance from the VCSEL chip 140 are formed to extend from the transparent substrate 161 at the four corners of the face of the MLA 160 facing the VCSEL chip 140. On the bottom faces of the leg portions 163, fixing patterns 164 are formed as adhesion fixing regions. For example, the fixing pattern 164 has a pattern of a stacked film in which Ti, Pt, and Au are stacked by vapor deposition in order from the side of the leg portion 163.

Each of the fixing patterns 164 is not necessarily required to be formed on the entire bottom surface of the leg portion 163 as long as the fixing pattern 164 is formed at a position facing the corresponding fixing pattern 181. The planar shape of the fixing pattern 164 is preferably equal to the planar shape of the fixing pattern 181.

As illustrated in FIG. 4 and the like, the fixing pattern 164 and the fixing pattern 181 are bonded to each other by an adhesive agent 182 such as low-temperature solder. The adhesive agent 182 is an example of a bonding member.

In the surface emitting laser module 100 configured as described above, the VCSEL elements 159 emit light from the face 141b of the VCSEL chip 140, and the emitted light enters the microlens 162 to be made into parallel light.

<Method for Forming VCSEL Chip 140>

Hereinafter, a method for forming the VCSEL chip 140 will be described. FIG. 10A to FIG. 10G are cross-sectional views illustrating the method forming the VCSEL chip 140. FIG. 10A to FIG. 10G illustrate changes in the cross section taken along line III-III of FIG. 6. FIG. 11A to FIG. 11G illustrate changes in the cross section taken along line IV-IV of FIG. 6.

First, as illustrated in FIG. 10A, the contact layer 142, the semiconductor multilayer reflector 143, the spacer layer 144, the active layer 145, the spacer layer 146, the semi-conductor multilayer reflector 147, and the contact layer 148 are grown in order on the substrate 141. For example, the selectively oxidized layer 151 (not illustrated) made of p-AlAs is included in the semiconductor multilayer reflector 147. A semiconductor stacked structure including the contact layer 142, the semiconductor multilayer reflector 143, the spacer layer 144, the active layer 145, the spacer layer 146, the semi-conductor multilayer reflector 147, and the contact layer 148 can be prepared, for example, by crystal growth according to a metal organic chemical vapor deposition (MOCVD) method or a molecular beam epitaxy (MBE) method. Here, an example using the MOCVD method will be explained. For example, trimethylaluminum (TMA), trimethylgallium (TMG), trimethylindium (TMI), and the like are used as materials of Group III, and phosphine ($PH_3$), and arsine ($AsH_3$) are used as materials of Group V. As an example, carbon tetrabromide ($CBr_4$) is used as the material of the p-type dopant, and hydrogen selenide ($H_2Se$) is used as the material of the n-type dopant. For example, the substrate 141 is an n-GaAs substrate whose surface is a mirror-polished surface.

Next, a resist pattern (not illustrated) is formed according to the desired planar shape of the mesas 150a and 150b on the contact layer 142 by using photolithography. Then, for example, parts of the semiconductor stacked structure that are not covered with the resist pattern are etched by, for example, an electron cyclotron resonance (ECR) etching method using $Cl_2$ gas. As a result, as illustrated in FIG. 10B and FIG. 11A, the mesas 150a and 150b are formed. At this time, the mesas 150a and 150b are formed so as to expose at least the selectively oxidized layer 151 (not illustrated). After etching, the resist pattern is removed. The etching bottom surface can be, for example, the upper surface of the spacer layer 144.

Next, as illustrated in FIG. 10C and FIG. 11B, in steam, thermal treatment (oxidation treatment) is applied to the semiconductor stacked structure, as an oxidation target, in which the mesas 150a and 150b are formed. As a result, Al (aluminum) in the selectively oxidized layer 151 is selectively oxidized from the outer periphery of the mesas 150a and 150b. Then, the non-oxidized area 151b that is not oxidized and that is surrounded by the oxidized area 151a of Al is left in the center of each of the mesas 150a and 150b. As a result, an oxide-confined structure is formed that restricts the drive current path of the light emitting unit only to the central part of the mesa 150a. The non-oxidized area 151b is a current passage area (current injection area).

Next, as illustrated in FIG. 10D and FIG. 11C, using photolithography, a resist pattern (not illustrated) is formed on the contact layer 142 and the spacer layer 144 according to the planar shape of the grooves 152. This resist pattern is formed so as to expose the areas where the first electrodes 157 are to be formed. Then, parts of the semiconductor stacked structure that are not covered with the resist pattern are etched by, for example, the ECR etching method using $Cl_2$ gas, whereby the grooves 152 reaching the contact layer 142 are formed. At this time, the contact layer 142 is exposed in the areas where the first electrodes 157 are to be formed. After the etching, the resist pattern is removed.

Next, as illustrated in FIG. 10E and FIG. 11D, for example, using the plasma CVD method, the optically transparent insulating layer 153 is formed so as to continuously cover the upper faces and side faces of the mesas 150a and 150b, the upper faces of the spacer layer 144, and the inner walls (the bottom and side faces of the grooves 152). Examples of materials of the insulating layer 153 include SiN, SiON, $SiO_2$, and the like.

Next, as illustrated in FIG. 10F, by using photolithography, the insulating layer 153 formed on a part of the upper face of the mesa 150a (excluding the outer peripheral part of the upper face of the contact layer 148) is removed to make a window, whereby an opening portion 154 (contact area) is formed.

Next, as illustrated in FIG. 10G and FIG. 11E, the p-side electrodes 155b, the inter-connects 155a, and the second electrodes 155 are formed by forming a resist pattern with photolithography, forming a metal film, and performing lift off. In forming the metal film, for example, Ti, Pt, and Au are stacked in order by vapor deposition on the insulating layer 153 and the contact layer 148 exposed through the opening portions 154.

Next, as illustrated in FIG. 11F, by using photolithography, in each of the areas where the first electrodes 157 are to be formed, a part of the insulating layer 153 is removed to make a window, whereby an opening portion 156 (contact area) is formed.

Next, as illustrated in FIG. 11G, the first electrodes 157 serving as n-side electrodes are formed by forming a resist pattern with photolithography, forming a metal film, and performing lift off. In forming the metal film, for example, AuGe, Ni, and Au are stacked in order by vapor deposition on the contact layer 142 exposed through the opening portions 156.

As described above, the VCSEL chip 140 can be formed.
<Method for Manufacturing Surface Emitting Laser Module 100>

Next, a method for manufacturing the surface emitting laser module 100 using the base substrate 120, the VCSEL chip 140, and the MLA 160 will be explained.

In this method, first, the VCSEL chip 140 is flip-chip mounted on the base substrate 120. As described above, the third electrodes 122 bonded to the first electrodes 157 and the fourth electrodes 123 bonded to the second electrode 155 are formed on the base substrate 120. The VCSEL chip 140 is placed above the base substrate 120 so that the first electrodes 157 and the third electrodes 122 face each other with solders sandwiched therebetween, and the second electrodes 155 and the fourth electrodes 123 face each other with solders sandwiched therebetween, and the solders are melted and solidified through heating and cooling. As descried above, the flip-chip bonding can be performed. Examples of usable solders include lead-free solder balls.

Next, the MLA 160 is bonded onto the VCSEL chip 140 by, for example, a self-alignment method. That is, the relative positions of the VCSEL chip 140 and the MLA 160 are adjusted so that the fixing patterns 164 and the fixing patterns 181 almost overlap in the top view, and low temperature solders are disposed as the adhesive agents 182 between the fixing patterns 164 and the fixing patterns 181. For example, examples of usable low temperature solders include solders with a melting point of about 140 degrees Celsius. Next, the MLA 160 bonded onto the VCSEL chip 140 is heated in a nitrogen atmosphere to melt the low-temperature solder. The molten low-temperature solder spreads between the fixing patterns 181 of the VCSEL chip 140 and the fixing patterns 164 of the MLA 160. At this time, a self-alignment occurs due to the restoring force of the molten low-temperature solder, and the MLA 160 can be aligned with the VCSEL chip 140 with high accuracy. In addition, the accuracy in the height direction can be ensured by applying same amounts of low-temperature solders to combinations at the four locations of the fixing patterns 181 and the fixing patterns 164. For example, the amounts of low-temperature solders are adjusted so that the distance between the VCSEL chip 140 and the MLA 160 is 100 μm. Thereafter, through the cooling process, the bonding of the MLA 160 is completed. The bonding method according to the self-alignment method is described in, for example, Japanese Unexamined Patent Application Publication No. 2016-40822.

Here, the effect of the present embodiment will be explained in comparison with a reference example. FIG. 12 is a cross-sectional view illustrating a surface emitting laser module according to the reference example. FIG. 13 is a top view illustrating a VCSEL chip according to the reference example.

The surface emitting laser module 900 according to the reference example includes a base substrate 920, a VCSEL chip 940 that is mounted on the base substrate 920 and that includes VCSEL elements, and an MLA 160.

The planar shape of the VCSEL chip 940 is a quadrangle, and a light emitting element unit 958 of which the planar shape is a quadrangle is provided at substantially the central portion of the face 941b facing the MLA 960. In the light emitting element unit 958, a total of 36 mesas 950a corresponding to the VCSEL elements are arranged in 6 by 6 grids in the direction X and the direction Y. Fixing patterns 981 are formed as adhesion fixing regions at the four corners of the face 941b at the outside of the light emitting element unit 958. Non-metal areas 983 are provided around the fixing patterns 981.

On the face 941b, a total of 36 second electrodes 955 are arranged such that 9 second electrodes 955 are arranged along each side of the light emitting element unit 958. Each of the 36 second electrodes 955 is individually connected to a p-side electrode of a corresponding one of the VCSEL elements via an interconnect 955a. The n-side electrodes of the 36 VCSEL elements are formed on a face 941a at the side opposite to the face 941b of the VCSEL chip 940, and are commonly connected to the electrode 922 formed on the substrate 921 of the base substrate 920. Furthermore, each of the 36 second electrodes 955 is individually connected via a bonding wire 959 to a corresponding one of 36 electrodes 923 formed on the substrate 921 of the base substrate 920. The second electrodes 955 are arranged at the outside of the quadrangle constituted by the four fixing patterns 981 in the top view in order to secure the space for the bonding wires 959 and due to limitation of the area by the non-metal areas 983.

In a case where the planar shape and the size of area of the light emitting element unit 158 are the same as the planar shape and the size of area of the light emitting element unit 958, the size of area of the VCSEL chip 140 according to the first embodiment is smaller than the size of area of the VCSEL chip 940 according to the reference example.

For example, in the first embodiment, the face 141a provided with the second electrodes 155 is different from the face 141b provided with the fixing patterns 181. Therefore, the fixing patterns 181 may overlap at least one of the first electrodes 157 and the second electrodes 155 in the top view as long as the fixing patterns 181 are out of the path of the light emitted from the VCSEL elements 159.

In the reference example, the second electrodes 955 and the fixing patterns 981 are provided on the same face 941b. For this reason, the non-metal area 983 is provided around the fixing pattern 981 in order to secure an insulating property. For example, in a case where the diameter of the fixing pattern 981 is 400 μm, the outer diameter of the non-metal area 983 is 800 μm. Accordingly, the VCSEL chip 940 requires a large area for the arrangement of the fixing patterns 981.

Further, in order to avoid contact between the bonding wire 959 and the MLA 160, the second electrodes 955 are disposed at the outside of the MLA 160 in the top view. For example, in a case where the distance from the base substrate 920 to the apex of the bonding wire 959 is 120 μm and the distance from the base substrate 920 to the lower end of the microlens 162 is 100 μm, the bonding wires 959 come into contact with the MLA 160 unless the second electrodes 955 are arranged at the outside of the MLA 160 in the top view. Therefore, the VCSEL chip 940 requires a large area for the arrangement of the second electrodes 955.

In a case where the distance from the base substrate 920 to the lower end of microlens 162 is more than 120 μm, the contact can be avoided, but in this case, it is necessary to increase the focal length of the microlens 162. In order to increase the focal length, it is necessary to increase the lens diameter. The increase in the lens diameter leads to an increase in the pitch of the microlenses 162 and the VCSEL elements. Therefore, also in this case, the size of the VCSEL chip 940 increases.

In contrast, the first embodiment does not have such a restriction. Therefore, according to the first embodiment, the size of the VCSEL chip 140 can be reduced. The reduction in the size of the VCSEL chip 140 leads to an increase in the number of VCSEL chips 140 that can be cut out from a wafer of any give size, which results in an effect of reduction in the cost of the VCSEL chips 140.

The planar shape of the light emitting element unit 158 is not required to be a quadrangle, but may be a circle as illustrated in illustrated in FIG. 14. In this case, on the face 141b facing the MLA 160, the fixing patterns 181 may be provided at positions that do not overlap either the first electrodes 157 or the second electrodes 155 in the top view.

Further, the arrangement of the VCSEL elements 159 in the light emitting element unit 158 is not required to be in a manner of an array, and for example, the VCSEL elements 159 may be arranged in a honeycomb arrangement.

Second Embodiment

Next, the second embodiment will be explained. The second embodiment relates to a surface emitting laser module. FIG. 15 is a top view illustrating a surface emitting laser module according to the second embodiment. FIG. 16 is a cross-sectional view illustrating a surface emitting laser module according to the second embodiment. FIG. 16 corresponds to a cross-sectional view taken along line I-I of FIG. 15. FIG. 17 is a cross-sectional view illustrating a portion of FIG. 16 in an enlarged manner.

As illustrated in FIG. 15 to FIG. 17, a surface emitting laser module 200 according to the second embodiment includes a base substrate 220, a VCSEL chip 140 that is mounted on the base substrate 220 and that includes VCSEL elements, and a MLA 260 including microlenses 262 which receive light exiting from the VCSEL elements. The VCSEL element is an example of a surface emitting laser element. The VCSEL chip 140 is an example of a surface emitting laser substrate. The microlens 262 is an example of an optical element. The MLA 260 is an example of an optical member.

In the present embodiment, the fixing patterns 181 are not formed on the face 141b of the VCSEL chip 140.

On a face 221a of the base substrate 220 facing the face 141a, third electrodes 122 bonded to the first electrodes 157 and fourth electrodes 123 bonded to the second electrodes 155 are formed on the substrate 221. For example, the number of the third electrodes 122 is 4, and the number of the fourth electrodes 123 is 36. The VCSEL chips 140 are flip-chip mounted on the base substrate 120. The fixing patterns 281 are formed as adhesion fixing regions at the four corners of the substrate 221 at the outside of the VCSEL chip 140 in the top view. The fixing pattern 281 has a pattern of a stacked film in which Ti, Pt, and Au are stacked in order from the side of the substrate 221.

The MLA 260 has a transparent substrate 261 made of, for example, quartz glass. The transparent substrate 261 is formed to be wider than the VCSEL chip 140 in the top view, and is wider than the transparent substrate 161 in the first embodiment. A lens area is provided at substantially the central portion of the face of the MLA 260 facing the VCSEL chip 140. For example, a total of 36 microlenses 262 are arranged in a manner of an array at positions corresponding to the respective VCSEL elements 159 in the lens area. Each microlens 262 is designed to perform a desired beam shaping for the radiation pattern of the VCSEL element 159. For example, the lens diameter is 45 μm and the focal length is 70 μm. Anti-reflection films are formed on both sides of the MLA 260.

Leg portions 163 for defining the distance from the base substrate 220 are formed to extend from the transparent substrate 261 at the four corners of the MLA 260 facing the VCSEL chip 140. On the bottom faces of the leg portions 163, fixing patterns 164 are formed as adhesion fixing regions.

The fixing pattern 164 and the fixing pattern 281 are bonded to each other by an adhesive agent 282 such as a low-temperature solder. The MLA 260 is bonded to the base substrate 220 by, for example, a self-alignment method. The adhesive agent 282 is an example of a bonding member.

In the first embodiment, regardless of the size of the first electrodes 157 and the second electrodes 155, the VCSEL chip 140 includes areas for the fixing patterns 181. Therefore, in a case where the first electrodes 157 and the second electrodes 155 are relatively small, the size of the VCSEL chip 140 is likely to be affected by the size of the fixing patterns 181.

In the second embodiment, the fixing patterns 281 are provided on the base substrate 220. Therefore, the VCSEL chip 140 does not require an area for the fixing patterns. Therefore, the size of the VCSEL chip 140 is not affected by the size of the fixing patterns 181, and when the first electrodes 157 and the second electrodes 155 are small, the size of the VCSEL chip 140 can be reduced accordingly.

It should be noted that the fixing pattern 164 and the fixing pattern 281 are not required to be bonded by a single adhesive agent 282, and for example, as illustrated in FIG. 18, a spacer 385 may be provided between the fixing pattern 164 and the fixing pattern 281. In this modification, the spacer 385 is fixed to the fixing pattern 281 by an adhesive agent 383, and the fixing pattern 164 is fixed to the spacer 385 by an adhesive agent 382. The combination of the adhesive agent 382, the spacer 385 and the adhesive agent 383 is an example of a bonding member.

In order for the MLA 260 to sufficiently receive the light emitted from the VCSEL element 159, it is desirable that the variation in the distance between the VCSEL chip 140 and the MLA 260 is ±3 μm or less. For example, in a case where the height of the VCSEL chip 140 is 250 μm and the distance between the face 141b of the VCSEL chip 140 and the lower end of the microlens 262 is attempted to be set to 100 μm, the distance from the upper face of the base substrate 220 to the lower end of microlens 262 is 350 μm. For such a long distance, i.e., 350 μm, it is difficult to reduce the variation to ±3 μm or less with only the surface tension of the adhesive agent 282 such as a single piece of solder and the like.

In this modification, the spacer 385 is provided. Therefore, the amounts of the adhesive agents 382 and 383 are smaller, and the variation in the distances is reduced by the surface tensions of the adhesive agents 382 and 383, and bonding can be performed with high accuracy. For example, low temperature solders can be used as the adhesive agents 382 and 383.

Examples of materials of the spacer 385 include silicon (Si) and quartz. Si has the advantages in a low material cost and in the ease of processing. Since quartz has a co-efficient of thermal expansion that is close to the coefficient of thermal expansion of the substrate 141 of the VCSEL chip 140, the quartz has an advantage in that the amount of variation in the distance between the VCSEL chip 140 and the MLA 260 can be reduced even when the VCSEL chip 140 generates heat during operation.

The oscillation wavelength of the VCSEL element is not limited to 940 nm band, and may be, for example, 980 nm band, 1.3 µm band, or 1.5 µm band. The material constituting the VCSEL element is not limited, and AlGaInAs or GaInPAs may be used for the VCSEL element. Also, the composition of each compound semiconductor layer is not particularly limited.

Further, the material of MLA is not limited to quartz glass, and for example, borosilicate glass may be used. The radius of curvature of the microlens can be designed according to the refractive index of the material. The microlens may be provided on a side of the transparent substrate opposite to the VCSEL chip.

The MLA bonding method is not limited to the self-alignment method. For example, bonding may be performed by a passive alignment method or an active alignment method. In the passive alignment method, for example, the MLA can be aligned using an alignment mark provided on the VCSEL chip or the base substrate and an alignment mark provided on the MLA. In the active alignment method, for example, the MLA can be adjusted to an optically appropriate position by moving the MLA in a state where the VCSEL chip is emitting light. When these bonding methods are employed, for example, an ultraviolet (UV) curable resin or a thermosetting resin can be used as the adhesive agent. The fixing patterns may not be used when the bonding is performed according to the self-alignment method.

The VCSEL chip 140 is an individual drive type VCSEL chip that can individually drive each of the VCSEL elements 159. However, the VCSEL chip used for the present disclosure may be a collective drive type VCSEL chip that collectively drives the VCSEL elements in the chip. In the collective drive type VCSEL chip, the number of second electrodes can be reduced. A surface emitting laser module including the collective drive type VCSEL chip can also achieve the effect of reducing the size of the VCSEL chip.

Alternatively, an electrode on a mesa corresponding to each VCSEL element, for example, a p-side electrode, may be directly bonded, as a second electrode, to an electrode on the base substrate. In this case, it is not necessary to provide the second electrodes at the outside of the light emitting element unit of the VCSEL chip in the top view.

Third Embodiment

Next, the third embodiment will be described. The third embodiment relates to a distance measuring device. A distance measuring device is an example of an optical device. FIG. 19 is a drawing illustrating a distance measuring device according to the third embodiment.

A distance measuring device 400 according to the third embodiment includes a light projecting unit 410, a light receiving unit 420, a time measurement circuit 430, and a control circuit 440.

The light projecting unit 410 includes, for example, a light source 411, a light source driving circuit 412, a light scanner 413, a light scanner driving circuit 414, a scan angle monitor 415, and a projection lens 416. The light source 411 includes a VCSEL module according to the first or second embodiment. The light source driving circuit 412 drives the light source 411 based on a driving signal output from the control circuit 440. The light scanner 413 includes a MEMS (Micro Electro Mechanical System) mirror, a polygon minor, or the like. The light scanner driving circuit 414 drives the light scanner 413 based on the driving signal output from the control circuit 440. The VCSEL module of the light source 411 has a plurality of light emitting sub-regions. Each of the sub light emitting regions includes one or more VCSEL elements, and the VCSEL elements in each of the light emitting sub-regions are electrically connected in parallel. The sub light emitting regions are arranged one-dimensionally in the scanning direction (in the sub scanning direction) of the light scanner 413, and can be driven individually. The VCSEL modules of the light source 411 are driven by the light source driving circuit 412 with, for example, a pulse current in the order of nanoseconds. The laser light emitted from the VCSEL element is converted into a desired beam profile by the projection lens 416 or the like as necessary, and thereafter, the light emission direction is determined by the light scanner 413 and the light is emitted to the outside of the distance measuring device 400. The scanning angle of the light scanner 413 is measured by the scan angle monitor 415, and the result is output to the control circuit 440. The light scanner 413 and the projection lens 416 are an example of a second optical element.

The laser light emitted to the outside of the distance measuring device 400 is reflected by a target object, returns back to the distance measuring device 400, and reaches the light receiving unit 420.

The light receiving unit 420 includes, for example, a light receiving element 421, a light receiving lens 422, and a band pass filter 423. The light receiving element 421 includes an APD (Avalanche Photo Diode) element of silicon. The light receiving lens 422 causes the light reaching the light receiving unit 420 to converge on the light receiving element 421. The band pass filter 423 includes a dielectric multilayer and is designed to transmit only light in the range of the oscillation wavelength of the light source 411. The band pass filter 423 can improve the S/N ratio of the signal.

The light that reaches the light receiving element 421 is converted into an electric signal by the light receiving element 421 and is input to the time measurement circuit 430 through an amplifier 431 and a comparator 432 as necessary.

The time measurement circuit 430 receives the driving signal of the light source 411 output from the control circuit 440 and the signal from the light receiving element 421. The time measurement circuit 430 measures the delay time between these two signals and outputs the result to the control circuit 440.

The control circuit 440 converts the delay time from the time measurement circuit 430 into the wavelength of light.

According to the distance measuring device 400, two-dimensional distance information can be obtained by measuring the distance to the target object by sequentially emitting the laser light to the spatial area decomposed by the light emitting sub-regions of the VCSEL modules and the light scanner 413. This distance measuring device 400 can be used for, for example, a LiDAR (Light Detection and Ranging).

In addition to the distance measuring device light source, the surface emitting laser module according to the present disclosure can be used as an excitation light source for a solid-state laser. The surface emitting laser module can be used as a light source device such as a projector in combination with an optical element, such as a fluorescent body, that converts the wavelength of the emitted light from the surface emitting laser module. The surface emitting laser module can also be used as a light source device for sensing in combination with an optical element, such as, e.g., a lens, a minor, or a diffraction grating, that diverge or converge the emitted light from the surface emitting laser module.

The preferred embodiments and the like have been described in detail above, but the present invention is not limited to the above-described embodiments and the like, and various modifications and substitutions can be applied to the above embodiments and the like without departing from the scope described in the claims.

REFERENCE SIGNS LIST 100, 200 surface emitting laser module
120, 220 base substrate
140 VCSEL chip
150a, 150b mesa
155 second electrode
157 first electrode
158 light emitting element unit
159 VCSEL element
160, 260 MLA
162 microlens
164, 181, 281 fixing pattern
182, 282, 382, 383 adhesive agent
385 spacer
400 distance measuring device
411 light source

CITATION LIST

Patent Literature

[PTL 1] Japanese Unexamined Patent Application Publication No.2007-142425

The present application is based on and claims the benefit of priority of Japanese Priority Application No. 2019-016353 filed on Jan. 31, 2019, the entire contents of which are hereby incorporated herein by reference.

The invention claimed is:

1. A surface emitting laser module comprising:
a base substrate;
a surface emitting laser substrate mounted on the base substrate, the surface emitting laser substrate including a surface emitting laser element, and the surface emitting laser substrate having a first face facing the base substrate and a second face facing away from the base substrate; and
an optical member facing the second face and including an optical element to receive light emitted from the second face of the surface emitting laser element,
wherein the surface emitting laser element includes:
a first semiconductor layer of a first conductivity type;
a second semiconductor layer of a second conductivity type;
a first electrode provided on the first face and connected to the first semiconductor layer; and
a second electrode provided on the first face and connected to the second semiconductor layer,
wherein the base substrate has a third face facing the first face of the surface emitting laser substrate, and includes:
a third electrode provided on the third face and connected to the first electrode; and
a fourth electrode provided on the third face and connected to the second electrode,
wherein the first electrode and the second electrode are disposed away from a light emitting element structure comprising an array of a plurality of mesas and is to generate light in the surface emitting laser element, and
wherein the second electrode and a current injection area of the plurality of mesas are connected by an interconnect.

2. The surface emitting laser module according to claim 1, wherein the surface emitting laser substrate is flip-chip mounted on the base substrate.

3. The surface emitting laser module according to claim 1, wherein the surface emitting laser element includes an active layer between the first semiconductor layer and the second semiconductor layer.

4. The surface emitting laser module according to claim 1, further comprising a bonding member bonding the optical member with the second face of the surface emitting laser substrate.

5. The surface emitting laser module according to claim 4, wherein, when viewed from a direction perpendicular to the second face of the surface emitting laser substrate, at least a part of the bonding member is included in an area in which the first electrode and the second electrode are included.

6. The surface emitting laser module according to claim 4, wherein, when viewed from a direction perpendicular to the second face of the surface emitting laser substrate, at least a part of the bonding member overlaps either the first electrode or the second electrode, or overlaps both of the first electrode and the second electrode.

7. The surface emitting laser module according to claim 1, further comprising a bonding member bonding the optical member with the third face of the base substrate.

8. The surface emitting laser module according to claim 7, wherein, when viewed from a direction perpendicular to the second face of the surface emitting laser substrate, the first electrode and the second electrode are disposed at a side of the surface emitting laser element relative to the bonding member.

9. The surface emitting laser module according to claim 7, wherein the bonding member includes a spacer interposed between the optical member and the base substrate.

10. An optical device comprising:
the surface emitting laser module according to claim 1; and
a second optical element to receive light emitted from the surface emitting laser module.

11. An optical device comprising:
the surface emitting laser module according to claim 1; and
a light receiving structure to receive light that is emitted by the surface emitting laser module and is reflected by or passing through a target object.

12. A surface emitting laser substrate having a first face and a second face opposite to the first face, the surface emitting laser substrate comprising:
a surface emitting laser element to emit light from the second face,
wherein the surface emitting laser element includes:
a first semiconductor layer of a first conductivity type;
a second semiconductor layer of a second conductivity type;
a first electrode provided on the first face and connected to the first semiconductor layer; and
a second electrode provided on the first face and connected to the second semiconductor layer, wherein the first electrode and the second electrode are disposed away from a light emitting element structure comprising an array of a plurality mesas and is to generate light in the surface emitting laser element, and wherein the second electrode and a current injection area of the plurality of mesas are connected by an interconnect.

13. The surface emitting laser substrate according to claim 12, wherein the surface emitting laser element includes an active layer between the first semiconductor layer and the second semiconductor layer.

14. The surface emitting laser substrate according to claim 12, further comprising:

a bonding area provided on the second face to be bonded with an optical element receiving light emitted from the surface emitting laser element.

* * * * *